(12) United States Patent
Truong et al.

(10) Patent No.: US 6,209,115 B1
(45) Date of Patent: Mar. 27, 2001

(54) REED-SOLOMON DECODER AND VLSI IMPLEMENTATION THEREOF

(76) Inventors: T. K. Truong; Shen-Li Fu, both of I-Shou University, Ta-Hsu Hsiang, Kaohsiung County (TW), 84008; T. C. Cheng, 1430 San Marino Ave., San Marino, CA (US) 91108

( * ) Notice: Subject to any disclaimer, the term of this patent is extended or adjusted under 35 U.S.C. 154(b) by 0 days.

(21) Appl. No.: 09/133,812

(22) Filed: Aug. 13, 1998

Related U.S. Application Data

(60) Provisional application No. 60/055,275, filed on Aug. 13, 1997, and provisional application No. 60/072,407, filed on Jan. 23, 1998.

(51) Int. Cl.[7] .................................................. H03M 13/15
(52) U.S. Cl. .................................................... 714/784
(58) Field of Search ............................................ 714/784

(56) References Cited

U.S. PATENT DOCUMENTS

| | | | |
|---|---|---|---|
| 4,504,948 | 3/1985 | Patel | 371/38 |
| 4,782,490 | 11/1988 | Tenengolts | 371/40 |
| 5,107,503 | 4/1992 | Riggle et al. | 371/37.1 |

OTHER PUBLICATIONS

Youzhi, "Implementation of Berlekamp–Massey algorithm without inversion", IEE Proceedings–1, vol. 138, No. 3, Jun. 1991, pp. 138–140.*

Reed et al., "VLSI design of inverse–free Berlekamp–Massey algorithm", IEE Proceedings –E, vol.138, No. 5, Sep. 1991, pp. 295–298.*

Shayan et al., "Modified Time–Domain Algortihm for Decoding Reed–Solomon Codes", IEEE Transactions on Communications, vol. 41, No. 7, Jul. 1993, pp. 1036–1038.*

Troung et al., "Inversionless Decoding of Both Errors and Erasures of Reed–Solomon Code", IEEE Transactions on Communications, vol. 46, No. 8, Aug. 1998, pp. 973–976.*

Eastman, Willard L., "Euclideanization of the Berlekamp––Massey Algorithm" Proceedings of the 1988 Tactical Communications Conference, vol. 1 (1988), pp.295–303.

* cited by examiner

*Primary Examiner*—Stephen M. Baker
(74) *Attorney, Agent, or Firm*—Christie, Parker & Hale, LLP

(57) ABSTRACT

A highly efficient Reed-Solomon decoding algorithm and a VLSI implementation thereof are used to correct errors found in data which was previously encoded utilizing Reed-Solomon encoding. The Reed-Solomon decoding algorithm takes advantage of certain desirable features of Euclid's algorithm and of the Berlekamp-Massey algorithm to provide a simplified and computationally efficient algorithm which eliminates the need to perform inverses.

8 Claims, 4 Drawing Sheets

REED-SOLOMON DECODER AND VLSI IMPLEMENTATION THEREOF

RELATED APPLICATIONS

This patent application claims the benefit of the filing dates of U.S. Provisional patent application Ser. No. 60/055,275, filed on Aug. 13, 1997 and entitled SIMPLIFIED PROCEDURE FOR CORRECTING ERRORS OF REED-SOLOMON CODE USING AN INVERSIONLESS THE [SIC] BERLEKAMP-MASSEY ALGORITHM; and U.S. Provisional patent application Ser. No. 60/072,407, filed on Jan. 23, 1998 and entitled VLSI DESIGN OF A DECODER FOR CORRECTING ERRORS OF REED-SOLOMON CODES USING AN INVERSIONLESS BERLEKAMP-MASSEY ALGORITHM, the contents of both of which are hereby incorporated by reference.

FIELD OF INVENTION

The present invention relates generally to forward error correcting methodology. The present invention relates more particularly to a method for decoding Reed-Solomon encoded data so as to effect error correction in a manner which is computationally efficient and which is suited for very large scale integrated circuit (VLSI) implementation. The present invention further comprises a VLSI implementation of the Reed-Solomon decoding methodology.

BACKGROUND OF THE INVENTION

As data storage densities and data transmission rates increase, the ability of hardware devices to correctly recognize binary data diminishes. Such binary data, which comprises a string of bits, i.e., zeros and ones, must be correctly recognized so as to facilitate the proper interpretation of the information represented thereby. That is, each individual zero and one needs to be interpreted reliably, so as to facilitate the accurate reconstruction of the stored and/or transmitted data represented thereby.

Such increased storage densities and transmission rates place a heavy burden upon the hardware utilized to recognize the state of individual bits. In contemporary storage devices, high storage densities dictate that the individual data bits be stored very close to one another. Further, in some data storage systems, the difference between the manner in which a one and a zero is stored in the media is not great enough to make the reading thereof as reliable as desired.

High data transmission rates imply either that the time allocated for each bit is substantially reduced, or that a modulation scheme is utilized wherein small differences in amplitude, frequency, and/or phase indicate a distinct sequence of bits, e.g., such as in multi-bit modulation. In either instance, the ability of hardware devices to accurately and reliably interpret such transmitted data is substantially reduced.

Although modern data storage systems are generally capable of limiting read errors to approximately one bit in ten billion, the extremely high volume of data processing typically being performed in contemporary data processing systems makes even such a seemingly low error rate unacceptable. In many systems, such an error rate would result in at least one error per day.

It must be appreciated that the incorrect reading of even a single bit of data may have highly undesirable effects. For example, the incorrect reading of a single bit of a computer program may cause the program to lock up or otherwise function incorrectly. Also, the incorrect reading of a single bit of numeric data may cause a number to be misread, which may have serious consequences when dealing with financial data, for example.

As those skilled on the art will appreciate, increasing data storage density and/or increasing data transmission speed inherently increases the bit error rate, i.e., the percentage of error bits contained in a message. It is desirable to be able to identify and correct data errors which occur during data storage and/or transmission operations. By being able to identify and correct such data errors, data may be stored more densely and/or transmitted more rapidly.

Further, the ability to correct data errors facilitates the use of mechanical devices, e.g., record/read heads, which are manufactured according to reduced tolerances and which are therefore less expensive. That is, hardware may be utilized which is more prone to introducing data errors, but which costs less.

Moreover, the ability to correct errors facilitates storage and transmission of data in low signal to noise environments. Thus, since data errors can be corrected, more noise can be tolerated within a storage medium (or rather the data signal can be recorded at a lower level as compared to the noise level, thus facilitating higher storage densities). Similarly, more noise can also be tolerated in data transmission, thereby facilitating increased data transmission speed.

The ability to store and transmit data in low signal to noise environments provides substantial benefit in satellite/spacecraft communications, compact disc (CD) recording, high definition television (HDTV), digital versatile disc (DVD) recording, network communications, and the like. In satellite/spacecraft communications, a weak signal (low signal to noise ratio) inherently results from the use of low power transmitters necessitated by weight constraints. In compact disc (CD) and digital disc (DVD) recording, being able to record in low signal to noise environments facilitates increased storage densities. In high definition television (HDTV) and network communications, being able to operate in low signal to noise environments facilitates communication at increased data transmission rates.

Error detection and correction methodologies for determining the existence of errors in stored and/or transmitted data and for correcting those errors are well known. Among the simplest of these methodologies is the use of data redundancy, wherein the data is repeated several times when it is stored or transmitted. When the data is read, a particular data error is unlikely to affect more than one occurrence of the data, such that a majority vote results in the correct data being recognized.

For example, a data byte may be stored three times. A data error is likely to affect only one of these three stored data bytes. Thus, the two correctly stored data bytes constitute a majority with respect to the incorrectly stored data byte, thereby identifying the data error and assuring correct interpretation of the stored data. However, as those skilled in the art will appreciate, such a majority vote method is extremely inefficient, since the data must be stored or transmitted several, e.g., 3, times. It is preferable to utilize an error detection and correction methodology which requires as few added bits to the message data as possible. This tends to minimize storage requirements and maximize transmission speed.

In an effort to overcome the deficiencies associated with the inefficient methodology of the majority vote system, various means for providing data correction which add only a few extra bits to the data have evolved. For example, the well known use of parity bits provides a much mnore efficient scheme for indicating the presence of a data error, although the use of simple parity alone does not facilitate the correction of such errors. When only parity error detection is used, then incorrectly transmitted data must be re-transmitted. Thus, although corrupt data is readily identifiable, corrupt data which was only present in a storage medium, and thus is not available for re-transmission, may not be recoverable.

Since it does not facilitate error correction without retransmission, parity is not a forward error correction methodology. In forward error correction methodologies, sufficient information is added to the stored or transmitted data to facilitate the reliable correction of data errors without requiring such retransmission, as long as a mathematically determined error rate is not exceeded.

It is desirable to provide a methodology for correcting burst errors. Burst errors involve the corruption of a plurality of consecutive bits. Burst errors are common in data storage and data transmission.

Burst errors typically occur during data storage due to faulty media. For example, a scratch or other imperfection upon a magnetic or optical storage medium may result in the loss or corruption of many consecutive bits stored upon the medium.

Burst errors typically occur during data transmission due to noise or static within the transmission frequency band. Signal fading and cross-talk may also cause burst errors during data transmission.

The well known Reed-Solomon encoding methodology provides an efficient means of error detection which also facilitates forward error correction, wherein a comparatively large number of data errors in stored and/or transmitted data can be corrected.

Reed-Solomon encoding is particularly well suited for correcting burst errors, wherein a plurality of consecutive bits become corrupted. For example, the implementation of Reed-Solomon encoding currently used to store information upon compact discs (CDs) is capable of correcting error bursts containing as many as four thousand consecutive bits.

Reed-Solomon encoding is based upon the arithmetic of finite fields. A basic definition of Reed-Solomon encoding states that encoding is performed by mapping from a vector space of M over a finite field K into a vector space of higher dimension over the same field. Essentially, this means that with a given character set, redundant characters are utilized to represent the original data in a manner which facilitates reconstruction of the original data when a number of the characters have become corrupted.

This may be better understood by visualizing Reed-Solomon code as specifying a polynomial which defines a smooth curve containing a large number of points. The polynomial and its associated curve represent the message. That is, points upon the curve are analogous to data points. A corrupted bit is analogous to a point that is not on the curve, and therefore is easily recognized as bad. It can thus be appreciated that a large number of such bad points may be present in such a curve without preventing accurate reconstruction of the proper curve (that is, the desired message). Of course, for this to be true, the curve must be defined by a larger number of points than are mathematically required to define the curve, so as to provide the necessary redundancy.

If N is the number of elements in the character set of the Reed-Solomon code, then the Reed-Solomon encode is capable of correcting a maximum of t errors, as long as the message length is less than N-2t.

Although the use of Reed-Solomon encoding provides substantial benefits by enhancing the reliability with which data may be stored or transmitted, the use of Reed-Solomon encoding according to contemporary practice possesses inherent deficiencies. These deficiencies are associated with the decoding of Reed-Solomon encoded data. It should be noted that in many applications, the encoding process is less critical than the decoding process. For example, since CDs are encoded only once, during the mastering process, and subsequently decoded many times by users, the encoding process can use slower, more complex and expensive technology. However, decoding must be performed rapidly to facilitate real-time use of the data, e.g., music, programs, etc., and must use devices which are cost competitive in the consumer electronics market. Thus, it is desirable to provide a VLSI device for performing Reed-Solomon decoding, since such VLSI devices tend to be comparatively fast and inexpensive.

Decoding Reed-Solomon encoded data involves the calculation of an error locator polynomial and an error evaluator polynomial. One of two methods is typically utilized to decode Reed-Solomon encoded data. The Berlekamp-Massey algorithm is the best known technique for finding the error locator. The Berlekamp-Massey algorithm is capable of being implemented in a VLSI chip. However, the Berlekamp-Massey algorithm utilizes an inversion process which undesirably increases the complexity of such a VLSI design and which is computationally intensive, thereby undesirably decreasing the speed of decoding process.

Also well known is the use of Euclid's algorithm for the decoding of Reed-Solomon encoded data. However, Euclid's algorithm utilizes a polynomial division methodology which is computationally intensive and which is difficult to implement in VLSI.

In view of the foregoing, it is desirable to provide a method for decoding Reed-Solomon encoded data which is easily and economically implemented as a VLSI chip and which is computationally efficient so as to substantially enhance decoding speed.

SUMMARY OF THE INVENTION

The present invention specifically addresses and alleviates the above mentioned deficiencies associated with the prior art. More particularly, the present invention comprises a highly efficient Reed-Solomon decoding algorithm and a VLSI implementation thereof. The VLSI implementation of the algorithm is used to correct errors found in data which was encoded utilizing Reed-Solomon encoding and is particularly well suited for low cost, high speed applications. The algorithm of the present invention takes advantage of certain desirable features of Euclid's algorithm and of the Berlekamp-Massey algorithm.

According to the present invention, the error locator polynomial and the error evaluator polynomial are calculated simultaneously and there is no need to perform polynomial divisions within the reiteration process. Further, the need to compute the discrepancies and to perform the field element inversions, as required by the prior art, is eliminated. Thus, the complexity of the VLSI implementation is substantially reduced and the processing time is shortened. A software simulation of the decoding algorithm of the present invention shows that the decoding process is faster than that of the original Euclid's algorithm and faster than the Berlekamp-Massey algorithm.

As discussed above, two different methods, Euclid's algorithms and the Berlekamp-Massey algorithm, for decoding Reed-Solomon encoded data are well known. Euclid's algorithm offers the advantage of facilitating the simultaneous calculation of the error evaluator polynomial along with the error locator polynomial. However, Euclid's algorithm is less efficient in practice than the Berlekamp-Massey algorithm because Euclid's algorithm performs polynomial divisions within the iteration process thereof.

The Berlekamp-Massey algorithm is the most widely used technique for determining the error locator polynomial and error evaluator polynomial. Although the Berlekamp-Massey algorithm can be implemented in a VLSI chip, such implementation is made undesirably complex by the Berlekamp-Massey algorithm's iteration process and field element inversions. Thus, the error locator polynomial and the error evaluator polynomial can be calculated simultaneously when using the Berlekamp-Massey algorithm with inverses.

According to the present invention, desirable features of Euclid's algorithm and the Berlekamp-Massey algorithm are utilized to reduce the complexity of a VLSI implementation of the decoding algorithm and to reduce the processing time required for decoding. More particularly, the present invention utilizes an iteration process similar to that of Euclid's algorithm. According to the present invention, field element inversion computations are eliminated as well. According to the present invention, the error evaluator polynomial is computed simultaneously with the error locator polynomial. Further simplifying computation, polynomial swaps are avoided. Thus, the decoding algorithm of the present invention is substantially easier to implement in a VLSI design, as compared to contemporary algorithms such as Euclid's algorithm and the Berlekamp-Massey algorithm.

The method for correcting errors in Reed-Solomon encoded data of the present invention can be practiced using either a general purpose computer or dedicated circuits, e.g., a VLSI implementation. As used herein, the term dedicated circuit refers to a circuit which facilitates Reed-Solomon decoding and which is not used in general purpose computing.

These, as well as other advantages of the present invention will be more apparent from the following description and drawings. It is understood that changes in the specific structure shown and described may be made within the scope of the claims without departing from the spirit of the invention.

DESCRIPTION OF THE PREFERRED EMBODIMENT

Figure 1:
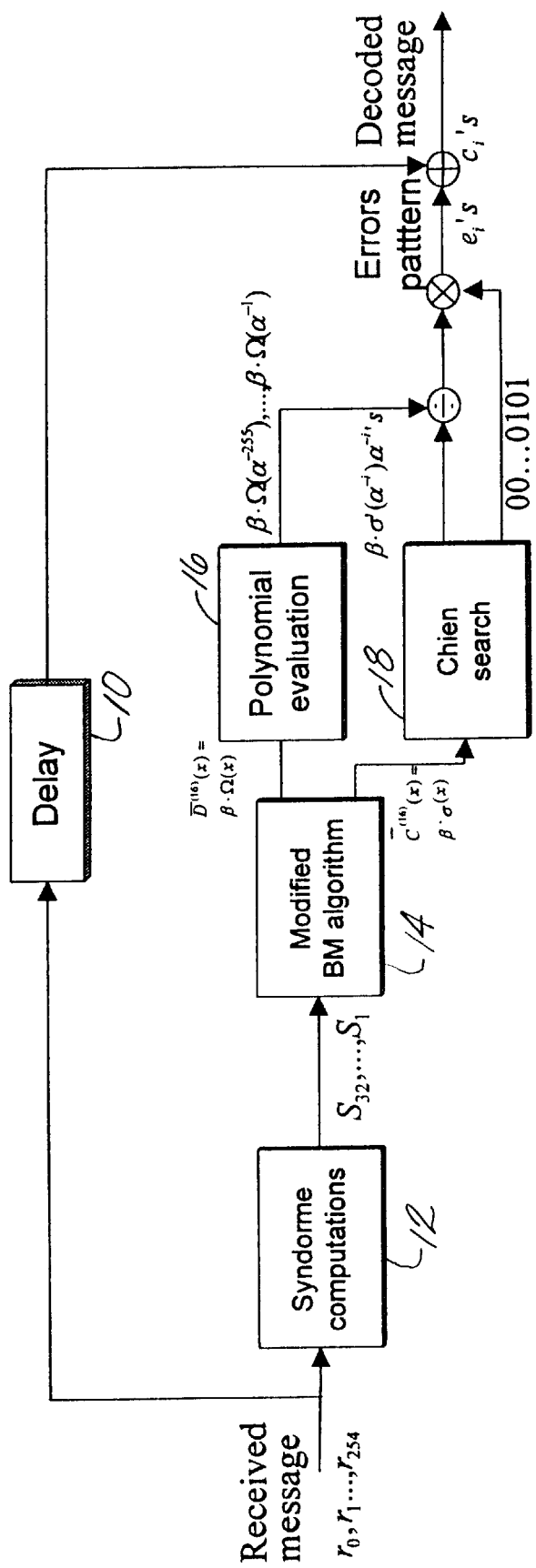
FIG. 1 is an overall block diagram of a pipeline (255, 223) Reed-Solomon domain decoder according to the present invention.

The detailed description set forth below in connection with the appended drawings is intended as a description of the presently preferred embodiment of the invention, and is not intended to represent the only form in which the present invention may be constructed or utilized. The detailed description sets forth the functions of the invention, as well as the sequence of steps for constructing and operating the invention in connection with the illustrated embodiment. It is to be understood, however, that the same or equivalent functions may be accomplished by different embodiments that are also intended to be encompassed within the spirit and scope of the invention.

The present invention comprises a decoding method for correcting errors which occur in Reed-Solomon (RS) encoded data by using a modified, i.e., inversionless, Berlekamp-Massey algorithm. The modified Berlekamp-Massey algorithm of the present invention provides a method which is readily incorporated into a VLSI design and which is comparatively fast as compared to contemporary Reed-Solomon decoding algorithms. According to the present invention, the error locator polynomial and the error evaluator polynomial are obtained simultaneously. As a consequence, the decoder can be made more modular, simpler, and is suitable for both VLSI and software implementation. An exemplary software simulation result and an example illustrating the pipeline and systolic array aspects of this decoder structure is given for a (225,223) Reed-Solomon code.

According to the present invention, the modified Berlekamp-Massey algorithm is improved such that it finds the error locator polynomial and the error evaluator polynomial simultaneously. In other words, the error locator polynomial and the error evaluator polynomial are computed directly by using the modified Berlekamp-Massey algorithm with no inverses. Thus, according to the present invention, the computation of inverse field elements is completely avoided in Berlekamp's key equation.

The modified Berlekamp-Massey algorithm is used to reduce the hardware complexity for the time domain decoder of Reed-Solomon codes of the present invention. As a consequence, an efficient VLSI implementation of time domain Reed-Solomon decoder is provided.

Time Domain Decoder for Reed-Solomon Codes

The algorithm for decoding Reed-Solomon encoded data according to the present invention is provided below. As discussed above, this algorithm avoids the need to perform inverses (as required by contemporary decoding algorithms). According to the present invention, the error evaluator polynomial and the error locator polynomial are computed simultaneously. This simplification of the decoding process makes the algorithm of the present invention suited for implementation in very large scale integrated circuit (VLSI) design.

The conventional decoder methodology is now explained in more detail. Let n be the block length of an (n, k) RS code in $GF(2^m)$, where k is the number of m-bit message symbols. Also, let d be the minimum distance of the code, where d−1 denotes the number of parity symbols. Thus, k=n−(d−1). Finally, let the code vector be $c=(c_0,c_1,c_2 \ldots ,c_{n-1})$. Also, let the error vector be $e=(e_0,e_1,e_2 \ldots ,e_{n-1})$. The received vector at the input of the RS decoder is r=c+e=$(r_0, r_1, r_2 \ldots , r_{n-1})$. Suppose that $v$ errors occur in the received vector $r$ and assume that $2v \leq d-1$. Then, the maximum number of errors in RS codes which can be corrected is $$t=\lfloor (d-1)/2 \rfloor \qquad (1)$$

where $\lfloor x \rfloor$ denotes the greatest integer less than or equal to $x$.

It is well known that the syndromes are defined by $$S_k = \sum_{i=0}^{n-1} r_i \alpha^{ik} = \sum_{i=0}^{n-1} e_i \alpha^{ik} + \sum_{i=0}^{n-1} c_i \alpha^{ik} \quad \text{for } 1 \le k \le d-1 \quad (2)$$

where $\alpha$ is a primitive element in $GF(_2m)$ and $S_k$ is known for $1 \le k \le d-1$. But $c_0 + c_1 \alpha^k + c_2 \alpha^{2k} \ldots + c_{n-1} \alpha^{(n-1)k} = 0$, for $1 \le k \le d-1$. Then, (2) becomes $$S_k = \sum_{i=1}^{v} Y_i X_i^k \quad \text{for } 1 \le k \le d-1 \quad (3)$$

where $X_i$ and $Y_i$ are the $i^{th}$ error amplitude and the $i^{th}$ error location, respectively.

Define the syndrome polynomial as $$S(x) = \sum_{k=1}^{d-1} S_k x^k. \quad (4)$$

A substitution of (3) into (4) yields $$S(x) = \sum_{k=1}^{d-1} \left( \sum_{i=1}^{v} Y_i X_i^k \right) x^k = \sum_{i=1}^{v} Y_i \left( \sum_{k=1}^{d-1} (X_i x)^k \right). \quad (5)$$

But $$\sum_{k=1}^{d-1} (X_i x)^k = \frac{X_i x + (X_i x)^d}{1 + X_i x}.$$

Thus (5) becomes $$S(x) = \sum_{i=1}^{v} Y_i \frac{X_i x + (X_i x)^d}{1 + X_i x} \equiv \sum_{i=1}^{v} Y_i \frac{X_i x}{1 - X_i x} \mod x^d. \quad (6)$$

Now, let the error locator polynomial be defined by $$\sigma(x) = \prod_{j=1}^{v} (1 + X_j x) = \sum_{j=0}^{v} \sigma_j x^j \quad (7)$$

where $\sigma(x)$ is the polynomial with zeros at the inverse error locations with $\sigma_0 = 1$ and $\deg\{\sigma(x)\} = v$. Finally, let the error evaluator polynomial be defined by $$P(x) = \sum_{i=1}^{v} Y_i X_i x \prod_{l \ne i} (1 + X_l x) \quad (8)$$

where $\deg\{P(x)\} = v$ and $P(0) = 0$. Hence (6) becomes $$S(x) \equiv \frac{P(x)}{\sigma(x)} \mod x^d. \quad (9)$$

Thus, by (9), Berlekamp's key equation is given by $$(1 + S(x))\sigma(x) \equiv \Omega(x) \mod x^d \quad (10)$$

where $\Omega(x) = \sigma(x) + P(x)$ with $\Omega(0) = 1$ and $\deg\{\Omega(x)\} = v$.

Thus, the error evaluator polynomial is given by $$P(x) \equiv \Omega(x) + \sigma(x). \quad (11)$$

It is well known that the Berlekamp-Massey algorithm can be used to find $\sigma(x)$ and $\Omega(x)$ in (10). For a given these known polynomials, the error evaluator polynomial can be obtained by (11). Note that $P(X_i^{-1}) = \Omega(X_i^{-1}) + \sigma(X_i^{-1}) = \Omega(X_i^{-1})$, where $X_i^{-1}$ is the reciprocal root of $\sigma(x)$ for $1 \le i \le v$.

The following algorithm is the iterative procedure developed by Berlekamp and Massey to find $\sigma(x)$ and $\Omega(x)$ that satisfies (10).

1. Initially define $C^{(0)}(x) = 1, D^{(0)}(x) = 1, A^{(0)}(x) = 1, B^{(0)}(x) = 0, l^{(0)} = 1$ and $k = 0$.

2. Set $k = k+1$ if $S_k$ is unknown stop. Otherwise define $$\Delta^k = \sum_{j=0}^{l^{(k-1)}} c_j^{(k-1)} s_{k-j} \quad (12)$$

and let $$C^{(k)}(x) = D^{(k-1)}(x) - \Delta^{(k)} B^{(k-1)}(x) \cdot x \quad (13)$$

$$D^{(k)}(x) = D^{(k-1)}(x) - \Delta^{(k)} B^{(k-1)}(x) \cdot x \quad (14)$$

$$A^{(k)}(x) = \begin{cases} x \cdot A^{(k-1)}(x), & \text{if } \Delta^{(k)} = 0 \text{ or if } 2l^{(k-1)} > k-1 \quad (15) \\ C^{(k-1)}(x)/\Delta^{(k)}, & \text{if } \Delta^{(k)} \ne 0 \text{ and } 2l^{(k-1)} \le k-1 \quad (16) \end{cases}$$

$$B^{(k)}(x) = \begin{cases} x \cdot B^{(k-1)}(x), & \text{if } \Delta^{(k)} = 0 \text{ or if } 2l^{(k-1)} > k-1 \quad (17) \\ D^{(k-1)}(x)/\Delta^{(k)}, & \text{if } \Delta^{(k)} \ne 0 \text{ and } 2l^{(k-1)} \le k-1 \quad (18) \end{cases}$$

and $$l^{(k)}(x) = \begin{cases} l^{(k-1)}, & \text{if } \Delta^{(k)} = 0 \text{ or if } 2l^{(k-1)} > k-1 \quad (19) \\ k - l^{(k-1)}(x), & \text{if } \Delta^{(k)} \ne 0 \text{ and } 2l^{(k-1)} \le k-1 \quad (20) \end{cases}$$

3. Return to step 2.

In this iterative procedure, $$\sigma(x) = C^{(d-1)}(x) \quad (21)$$

and $$\Omega(x) = D^{(d-1)}(x). \quad (22)$$

The errors are located by finding the reciprocal root of the polynomial $\sigma(x)$ in (21). These roots are usually found by a Chien-search procedure. Note that in (16) and (18) there are only two places in the algorithm where the inversion of the element $\Delta^{(k)}$ is required. It is well known that inversion takes many operations or special hardware. The modified Berlekamp Massey algorithm is developed for finding the error locator polynomial and the error evaluator polynomial that satisfies (10). The following algorithm is the modified Berlekamp-Massey algorithm which eliminates the requirement for inversion.

1. Initially define $\overline{C}^{(0)}(x) = 1, \overline{D}^{(0)}(x) = 1, \overline{A}^{(0)}(x) = 1, \overline{B}^{(0)}(x) = 0, \overline{l}^{(0)} = 0, \gamma^{(k)} = 1$ if $k \le 0$.

2. Set $k = k+1$ if $k = d-1$, stop. Otherwise, define $$\overline{\Delta}^{(k)} = \sum_{j=0}^{\overline{l}^{(k-1)}} \overline{c}_j^{(k-1)} s_{k-j} \quad (23)$$

and let $$\overline{C}^{(k)}(x) = \gamma^{(k-1)} \overline{C}^{(k-1)}(x) - \overline{\Delta}^{(k)} \overline{A}^{(k-1)}(x) \cdot x \quad (24)$$

-continued $$\overline{D}^{(k)}(x) = \gamma^{(k-1)}\overline{D}^{(k-1)}(x) - \overline{\Delta}^{(k)}\overline{B}^{(k-1)}(x) \cdot x \quad (25)$$

$$\overline{A}^{(k)}(x) = \begin{cases} x \cdot \overline{A}^{(k-1)}(x), & \text{if } \overline{\Delta}^{(k)} = 0 \text{ or if } 2\overline{l}^{(k-1)} > k-1 & (26) \\ \overline{C}^{(k-1)}(x), & \text{if } \overline{\Delta}^{(k)} \neq 0 \text{ and } 2\overline{l}^{(k-1)} \leq k-1 & (27) \end{cases}$$

$$\overline{B}^{(k)}(x) = \begin{cases} x \cdot \overline{B}^{(k-1)}(x), & \text{if } \overline{\Delta}^{(k)} = 0 \text{ or if } 2\overline{l}^{(k-1)} > k-1 & (28) \\ \overline{D}^{(k-1)}(x), & \text{if } \overline{\Delta}^{(k)} \neq 0 \text{ and } 2\overline{l}^{(k-1)} \leq k-1 & (29) \end{cases}$$

$$\overline{l}^{(k)}(x) = \begin{cases} \overline{l}^{(k-1)}, & \text{if } \overline{\Delta}^{(k)} = 0 \text{ or if } 2\overline{l}^{(k-1)} > k-1 & (30) \\ k - \overline{l}^{(k-1)}(x), & \text{if } \overline{\Delta}^{(k)} \neq 0 \text{ and } 2\overline{l}^{(k-1)} \leq k-1 & (31) \end{cases}$$

$$\gamma^{(k)} = \begin{cases} \gamma^{(k-1)}, & \text{if } \overline{\Delta}^{(k)} = 0 \text{ or if } 2\overline{l}^{(k-1)} > k-1 & (32) \\ \overline{\Delta}^{(k)}, & \text{if } \overline{\Delta}^{(k)} \neq 0 \text{ and } 2\overline{l}^{(k-1)} \leq k-1 & (33) \end{cases}$$

3. Return to step 2.

The following theorem illustrates the principal relations of these two algorithms.

Theorem 1. For $0 \leq n \leq d-1$, $$\overline{C}^{(n)}(x) = \prod_{i=-1}^{n-1} \gamma^{(i)} C^{(n)}(x) \quad (34)$$

$$\overline{D}^{(n)}(x) = \prod_{i=-1}^{n-1} \gamma^{(i)} D^{(n)}(x) \quad (35)$$

$$\overline{A}^{(n)}(x) = \gamma^{(n)} A^{(n)}(x) \quad (36)$$

$$\overline{B}^{(n)}(x) = \gamma^{(n)} A^{(n)}(x) \quad (37)$$

and $$\overline{l}^{(n)} = l^{(n)} \quad (38)$$

where $C^{(k)}(x)$, $D^{(k)}(x)$, $A^{(k)}(x)$, $B^{(k)}(x)$ and $l^{(k)}$ are defined in (13)–(20), for n=k.

Proof. Theorem 1 can be proved by induction. By definition, the relations in (34)–(38) hold for n=0. Assume (34)–(38) hold for n=k−1. For n=k, a substitution of (34) for n=k−1 into (23) yields $$\overline{\Delta}_k = \sum_{j=0}^{\overline{l}^{(k-1)}} \left( \prod_{i=-1}^{k-2} \gamma^{(i)} c_j^{(k-1)} \right) s_{k-j} \quad (39)$$

$$= \prod_{i=-1}^{k-2} \gamma^{(i)} \sum_{j=0}^{\overline{l}^{(k-1)}} c_j^{(k-1)} s_{k-j} = \prod_{i=-1}^{k-2} \gamma^{(i)} \Delta^{(k)}$$

where $\gamma^{(i)}=1$ for i=0 or −1. A substitution of (34) for n=k−1, (36) for n=k−1 and (39) into (24) yields $$\overline{C}^{(k)}(x) = \gamma^{(k-1)} \left( \prod_{i=-1}^{k-2} \gamma^{(i)} C^{(k-1)}(x) \right) - \left( \prod_{i=-1}^{k-2} \gamma^{(i)} \Delta^{(k)} \right) \cdot \quad (40)$$

$$(\gamma^{(k-1)} A^{(k-1)}(x)) x$$

$$= \gamma^{(k-1)} \prod_{i=-1}^{k-2} \gamma^{(i)} (C^{(k-1)}(x) - \Delta^{(k)} A^{(k-1)}(x) x)$$

By (13), (40) becomes $$\overline{C}^{(k)}(x) = \gamma^{(k-1)} \prod_{i=-1}^{k-2} \gamma^{(i)} C^{(k)}(x) = \prod_{i=-1}^{k-1} \gamma^{(i)} C^{(k)}(x) \quad (41)$$

Thus, (34) is proved.

Using a technique similar to that used for derivation of (39), once can derive (35).

Note by (39) that $\overline{\Delta}^{(k)}=0$ if $\Delta^{(k)}=0$ and $\overline{\Delta}^{(k)} \neq 0$ if $\Delta^{(k)} \neq 0$ because $\gamma^{(i)} \neq 0$ for $-1 < i \leq k-2$. Hence, if $\overline{\Delta}^{(k)} = \Delta^{(k)} = 0$ or if $2\overline{l}^{(k-1)} = 2l^{(k-1)} > k-1$, then, by (26) and (36) for n=k−1, one has $$\overline{A}^{(k)}(x) = x \cdot \overline{A}^{(k-1)}(x) = x \cdot \gamma^{(k-1)} A^{(k-1)}(x). \quad (42)$$

But $\gamma^{(k)}=\gamma^{(k-1)}$ in (32) and $A^{(k)}(x)=x \cdot A^{(k-1)}(x)$ in (15). Thus, (42) becomes $\overline{A}^{(k)}(x)=\gamma^{(k)} A^{(k)}(x)$. If $\overline{\Delta}^{(k)}=\Delta^{(k)} \neq 0$ and $2\overline{l}^{(k-1)}=2l^{(k-1)} \leq k-1$, then, by (27), (34) for n=k−1 and (39), one has $$\overline{A}^{(k)}(x) = \overline{C}^{(k-1)}(x) = \prod_{i=-1}^{k-2} \gamma^{(i)} C^{(k-1)}(x) \quad (43)$$

$$= \left( \frac{\overline{\Delta}^{(k)}}{\Delta^{(k)}} \right) C^{(k-1)}(x) = \overline{\Delta}^{(k)} \left( \frac{C^{(k-1)}(x)}{\Delta^{(k)}} \right)$$

But, by (16) and (33), (43) becomes $\overline{A}^{(k)}(x)=\gamma^{(k)} A^{(k)}(x)$. Thus (36) is proved. Using a technique similar to that used for derivation of (36), one can derived (37). If $\overline{\Delta}^{(k)}=\Delta^{(k)}=0$ or if $2\overline{l}^{(k-1)}>k-1$, then $\overline{l}^{(k)}=\overline{l}^{(k-1)}=l^{(k-1)}=l^{(k)}$. If $\overline{\Delta}^{(k)}=\Delta^{(k)} \neq 0$ or if $2\overline{l}^{(k-1)}=2l^{(k-1)} \leq k-1$, then $\overline{l}^{(k)}=k-\overline{l}^{(k-1)}=k-l^{(k-1)}=l^{(k)}$. Thus, (38) is proved. Hence, the theorem is proved.

From (38) and (35), the modified error locator polynomial and error evaluator polynomial are given by.

$$\overline{C}^{(d-1)}(x) = \beta \cdot C^{(d-1)}(x) = \beta \cdot \sigma(x) = (\beta\sigma_0, \beta\sigma_1, \ldots \beta\sigma_{d-1}) \quad (44)$$

and $$\overline{D}^{(d-1)}(x) = \quad (45)$$
$$\beta \cdot D^{(d-1)}(x) = \beta \cdot \Omega(x) = (\beta \cdot \Omega_0, \beta \cdot \Omega_1, \ldots \beta \cdot \Omega_{d-1})$$

where $$\beta = \prod_{i=-1}^{d-2} \gamma^{(i)} = \overline{C}^{(d-1)}(0) = \overline{D}^{(d-1)}(0) \quad (46)$$

is a field element in $GF(2^m)$.

Therefore, by (44) and (45), the error locator polynomial and the error evaluator polynomial are obtained by $$\sigma(x) = \frac{\overline{C}^{(d-1)}(x)}{\beta} \quad (47)$$

and $$P(x) = \Omega(x) - \sigma(x) = \frac{\overline{D}^{(d-1)}(x)}{\beta} - \sigma(x). \quad (48)$$

The errors are located by finding the reciprocal root of the polynomial $\sigma(x)$ in (47) or $\overline{C}^{(d-1)}(x)$ in (44). The Forney algorithm can be used to find the error magnitudes from $P(x)$ given in (8). This algorithm is illustrated as follows:

By [14], evaluating (8) and (11) at $X_j^{-1}$ yields $$P(X_j^{-1}) = \Omega(X_j^{-1}) = Y_j \prod_{l \neq j} (1 - X_l X_j^{-1}). \quad (49)$$

By (47) and (49), the error magnitudes are given by $$Y_j = \frac{\Omega(X_j^{-1})}{\prod_{l \neq j}(1 - X_l X_j^{-1})} = \frac{\Omega(X_j^{-1})}{X_j^{-1}\sigma'(X_j^{-1})} = \frac{\overline{D}^{(d-1)}(X_j^{-1})}{X_j^{-1}\overline{C}^{(d-1)'}(X_j^{-1})} \quad (50)$$

where $$\sigma'(X_j^{-1}) = X_j \prod_{l \neq j}(1 - X_l X_j^{-1})$$

and $$\overline{C}^{(d-1)'}(X_j^{-1}) = \beta \cdot \sigma'(X_j^{-1})$$

are the derivative with respect to $x$ of $\sigma(x)$ given in (7) and $\overline{C}^{(d-1)'}(x)$ given in (44) evaluated at $x = X_j^{-1}$, respectively.

Let us recapitulate the decoding of RS codes for errors using the modified Berlekamp-Massey algorithm which eliminates the requirement for inversion. This procedures is composed of the following four steps:

Step 1. If v>t, the best policy is not to decode the message. Otherwise, compute the syndrome values $S_1, S_2, \ldots S_{d-1}$ from (2). If $S_k=0$ for $1 \leq k \leq d-1$, the received word is a codeword and no further processing is needed.

Step 2. Use an inversionless Berlekamp-Massey algorithm to determine the modified error locator polynomial $\beta \cdot \sigma(x)$ and the modified error evaluator polynomial $\beta \cdot \Omega(x)$ from the known $S_k$ for $1 \leq k \leq d-1$.

Step 3. Compute the roots of $\beta \cdot \sigma(x)$ using the Chien search. The roots of $\beta \cdot \sigma(x)$ are the inverse locations of the v errors.

Step 4. Compute the error values from (50).

To illustrate the time domain decoder for correcting errors a (15,9) Reed-Solomon triple-error correcting code over $GF(2^4)$ is now presented, The representation of the filed $GF(2^4)$ generated by the primitive irreducible polynomial $p(x)=x^4+x+1$ is given in Table 1 as follows:

TABLE 1

Representations of the elements of GF $(2^4)$ generated by $\alpha^4 + \alpha + 1 = 0$

| Zero and Powers of $\alpha$ | Polynomials over GF $(2^4)$ | vectors over GF $(2^4)$ |
|---|---|---|
| 0 | 0 | 0000 |
| $\alpha^0$ | 1 | 0001 |
| $\alpha^1$ | $\alpha$ | 0010 |
| $\alpha^2$ | $\alpha^2$ | 0100 |
| $\alpha^3$ | $\alpha^3$ | 1000 |
| $\alpha^4$ | $\alpha + 1$ | 0011 |
| $\alpha^5$ | $\alpha^2 + \alpha$ | 0110 |
| $\alpha^6$ | $\alpha^3 + \alpha^2$ | 1100 |
| $\alpha^7$ | $\alpha^3 + \alpha + 1$ | 1011 |
| $\alpha^8$ | $\alpha^2 + 1$ | 0101 |
| $\alpha^9$ | $\alpha^3 + \alpha$ | 1010 |
| $\alpha^{10}$ | $\alpha^2 + \alpha + 1$ | 0111 |
| $\alpha^{11}$ | $\alpha^3 + \alpha^2 + \alpha$ | 1110 |
| $\alpha^{12}$ | $\alpha^3 + \alpha^2 + \alpha + 1$ | 1111 |
| $\alpha^{13}$ | $\alpha^3 + \alpha^2 + 1$ | 1101 |
| $\alpha^{14}$ | $\alpha^3 + 1$ | 1001 |

For example, consider a (15,9) Reed-Solomon code over GF $(2^4)$ with a minimum distance d=7 In this code, v errors under the condition $2^v \leq 6$ can be corrected. Thus, the generator polynomial of such a (15,9) Reed-Solomon code is defined by $$g(x) = \prod_{i=1}^{6}(x - \alpha^i) = x^6 + \alpha^{10}x^5 + \alpha^{14}x^4 + \alpha^4 x^3 + \alpha^6 x^2 + \alpha^9 x + \alpha^6.$$

Assume the message symbols are all zeros. The encoded code word, which is a multiple of g(x), is C(x)=0. Written as a vector, the code word is $^c=(0,0,0,0,0,0,0,0,0,0,0,0,0,0,0)$ Assume the error vector is $^e=(0,0,\alpha^{11},0,0,\alpha^5,0,\alpha,0,0,0,0,0,0,0)$. Thus, the received vector is r=c+e. By (2), the syndromes $S_k$ for $r$ are $$S_k = \sum_{n=0}^{14} r_n \alpha^{nk} = \alpha^{11}(\alpha^2)^k + \alpha^5(\alpha^5)^k + \alpha(\alpha^7)^k \text{ for } 1 \leq k \leq 6.$$

This yields $S_1=\alpha^{12}, S_2=1, S_3=\alpha^{14}, S_4=\alpha^{13}, S_5=1$ and $S_6=\alpha^{11}$ Thus, the syndrome polynomial is $$S(x)=\alpha^{12}x+x^2+\alpha^{14}x^3+\alpha^{13}x^4+x^5+\alpha^{11}x^6. \quad (51)$$

In this example, by (1), the maximum error correcting capability is $t=\lfloor(d-1)/2\rfloor=6/2=3$.

The modified Berlekamp-Massey algorithm is applied next to S($^x$) given in (51). By this means, the modified error locator polynomial and the modified error evaluator polynomial are determined by a use of the modified Berlekamp-Massey algorithm. These are accomplished by the recursive formula (24) and (25), given in Table 2. From Table 2, one can observe that the computation terminates at k=6 and the modified error locator polynomial $\overline{C}^{(6)}(x)$ is obtained. That is, $$\overline{C}^{(6)}(x)=\alpha^5+\alpha^4 x+\alpha x^2+\alpha^4 x^3 \quad (52)$$

where $\deg\{\overline{C}^{(6)}(x)\}=3$ and $\beta=\overline{C}^{(6)}(0)=\alpha^5$.

By (47), the error locator polynomial is $\sigma(x)=\overline{C}^{(6)}(x)/\beta=1+\alpha^{14}x+\alpha^{11}x^2+\alpha^{14}x^3$. By the derivative with respect to $x$ of in (52), one obtains $$\overline{C}^{(6)'}(x)=\alpha^4+\alpha^4 x^2. \quad (53)$$

Using the Chien search, the root of $\overline{C}^{(6)}(x)$ constitute the set $\{\alpha^{-2},\alpha^{-5},\alpha^{-7}\}$. Also from Table 2, the modified error evaluate polynomial is obtained. That is, $$\overline{D}^6(x)=(\alpha^5+\alpha^{10}x+\alpha^5 x^2+\alpha^{11}x^3). \quad (54)$$

Thus, by (50), the error values are $$Y_1 = \frac{\overline{D}^{(6)}(\alpha^{-2})}{\alpha^{-2}\overline{C}^{(6)'}(\alpha^{-2})} = \frac{\alpha^5+\alpha^{10}(\alpha^{-2})+\alpha^5(\alpha^{-2})^2+\alpha^{11}(\alpha^{-2})^3}{\alpha^{-2}(\alpha^4+\alpha^4(\alpha^{-2})^2)} = \alpha^{11}$$

Similarly, one obtains $$Y_2 = \frac{\overline{D}^{(6)}(\alpha^{-5})}{\alpha^{-5}\overline{C}^{(6)'}(\alpha^{-5})} = \frac{\alpha^5+\alpha^{10}(\alpha^{-5})+\alpha^5(\alpha^{-5})^2+\alpha^{11}(\alpha^{-5})^3}{\alpha^{-5}(\alpha^4+\alpha^4(\alpha^{-5})^2)} = \alpha^5$$

and $$Y_3 = \frac{\overline{D}^{(6)}(\alpha^{-7})}{\alpha^{-7}\overline{C}^{(6)'}(\alpha^{-7})} = \frac{\alpha^5+\alpha^{10}(\alpha^{-7})+\alpha^5(\alpha^{-7})^2+\alpha^{11}(\alpha^{-7})^3}{\alpha^{-7}(\alpha^4+\alpha^4(\alpha^{-7})^2)} = \alpha$$

Table 2 below is an example of the modified Berlekamp-Massey algorithm used to find the modified polynomials $\beta x \sigma(x)$ and $\beta x \Omega(x)$.

| k | $\bar{\Delta}^{(k)}$ | $\bar{C}^{(k)}(x)$ | $\bar{A}^{(k)}(x)$ | $\bar{D}^{(k)}(x)$ | $\bar{B}^{(k)}(x)$ | $\gamma^{(k)}$ | $l^{(k)}$ |
|---|---|---|---|---|---|---|---|
| 0 | 0 | $\bar{C}^{(0)}(x) = 1$ | $\bar{A}^{(0)}(x) = 1$ | $\bar{D}^{(0)}(x) = 1$ | $\bar{B}^{(0)}(x) = 0$ | $\gamma^{(0)} = 1$ | $l^{(0)} = 0$ |
| 1 | $\bar{\Delta}^{(1)} = \sum_{j=0}^{l^{(0)}=0} \bar{C}_j^{(0)} S_{1-j}$ $= \bar{C}_0^{(0)} S_1$ $= \alpha^{12}$ | $\bar{C}^{(1)}(x) = \gamma^{(0)} \bar{C}^{(0)}(x) - \bar{\Delta}^{(1)} \bar{A}^{(0)}(x) x$ $= 1 + \alpha^{12} x$ | $2l^{(0)} = k-1$ $\bar{A}^{(1)}(x) = \bar{C}^{(0)}(x)$ $= 1$ | $\bar{D}^{(1)}(x) = \gamma^{(0)} \bar{D}^{(0)}(x) - \bar{\Delta}^{(1)} \bar{B}^{(0)}(x)$ $= 1 + \alpha^{12} \cdot 0 \cdot x$ $= 1$ | $\bar{B}^{(1)}(x) = x\bar{B}^{(0)}(x) =$ | $\gamma^{(1)} = \bar{\Delta}^{(1)}$ $= \alpha^{12}$ | $l^{(1)} = k - l^{(0)}$ $= 1$ |
| 2 | $\bar{\Delta}^{(2)} = \sum_{j=0}^{l^{(1)}=1} \bar{C}_j^{(1)} S_{2-j}$ $= \bar{C}_0^{(1)} S_2 + \bar{C}_1^{(1)} S_1$ $= 1 \cdot 1 + \alpha^{12} \cdot \alpha^{12}$ $= \alpha^7$ | $\bar{C}^{(2)}(x) = \gamma^{(1)} \bar{C}^{(1)}(x) - \bar{\Delta}^{(2)} \bar{A}^{(1)}(x) x$ $= \alpha^{12} \cdot (1 + \alpha^{12} x) + \alpha^7 \cdot 1 \cdot x$ $= \alpha^{12} + x$ | $2l^{(1)} > k-1$ $\bar{A}^{(2)}(x) = x \cdot \bar{A}^{(1)}(x)$ $= x \cdot 1$ $= x$ | $\bar{D}^{(2)}(x) = \gamma^{(1)} \bar{D}^{(1)}(x) - \bar{\Delta}^{(2)} \bar{B}^{(1)}(x)$ $= \alpha^{12} \cdot 1 + \alpha^7 \cdot 1 \cdot x$ $= \alpha^{12} + \alpha^7 x$ | $\bar{B}^{(2)}(x) = x\bar{B}^{(1)}(x)$ $= x \cdot 1$ $= x$ | $\gamma^{(2)} = \gamma^{(1)}$ $= \alpha^{12}$ | $l^{(2)} = l^{(1)}$ $= 1$ |
| 3 | $\bar{\Delta}^{(3)} = \sum_{j=0}^{l^{(2)}=1} \bar{C}_j^{(2)} S_{3-j}$ $= \bar{C}_0^{(2)} S_3 + \bar{C}_1^{(2)} S_2$ $= \alpha^{12} \cdot \alpha^{14} + 1 \cdot 1$ $= \alpha^{12}$ | $\bar{C}^{(3)}(x) = \gamma^{(2)} \bar{C}^{(2)}(x) - \bar{\Delta}^{(3)} \bar{A}^{(2)}(x) x$ $= \alpha^{12} \cdot (\alpha^{12} + x) + \alpha^{12} \cdot x \cdot x$ $= \alpha^9 + \alpha^{12} x + \alpha^{12} x^2$ | $2l^{(2)} = k-1$ $\bar{A}^{(3)}(x) = \bar{C}^{(2)}(x)$ $= \alpha^{12} + x$ | $\bar{D}^{(3)}(x) = \gamma^{(2)} \bar{D}^{(2)}(x) - \bar{\Delta}^{(3)} \bar{B}^{(2)}(x) \cdot x$ $= \alpha^{12} \cdot (\alpha^{12} + \alpha^7 x) + \alpha^{12} \cdot x \cdot x$ $= \alpha^9 + \alpha^4 x + \alpha^{12} x^2$ | $\bar{B}^{(3)}(x) = \bar{D}^{(2)}(x)$ $= \alpha^{12} + \alpha^7 x$ | $\gamma^{(3)} = \bar{\Delta}^{(3)}$ $= \alpha^{12}$ | $l^{(3)} = k - l^{(2)}$ $= 2$ |

-continued

| k | $\overline{\Delta}^{(k)}$ | $\overline{C}^{(k)}(x)$ | $\overline{A}^{(k)}(x)$ | $\overline{D}^{(k)}(x)$ | $\overline{B}^{(k)}(x)$ | $\gamma^{(k)}$ | $\overline{l}^{(k)}$ |
|---|---|---|---|---|---|---|---|
| 4 | $\overline{\Delta}^{(4)} = \sum_{j=0}^{l^{(1)}=2} \overline{C}_j^{(3)} S_{4-j}$ $= \overline{C}_0^{(3)} S_4 + \overline{C}_1^{(3)} S_3 + \overline{C}_2^{(3)} S_2$ $= \alpha^9 \cdot \alpha^{13} + \alpha^{12} \cdot \alpha^{14} + \alpha^{12} \cdot 1$ $= \alpha^9$ | $\overline{C}^{(4)}(x) = \gamma^{(3)} \overline{C}^{(3)}(x) - \overline{\Delta}^{(4)} \overline{A}^{(3)}(x)x$ $= \alpha^{12} \cdot (\alpha^9 + \alpha^{12}x + \alpha^{12}x^2) +$ $\alpha^9 \cdot (\alpha^{12} + x)x$ $= \alpha^6 + \alpha^5 x$ | $2l^{(3)} > k-1$ $\overline{A}^{(4)}(x) = x \cdot \overline{A}^{(3)}(x)$ $= x(\alpha^{12} + x)$ $= \alpha^{12}x + x^2$ | $\overline{D}^{(4)}(x) = \gamma^{(3)} \overline{D}^{(3)}(x) - \overline{\Delta}^{(4)} \overline{B}^{(3)}(x)x$ $= \alpha^{12}(\alpha^9 + \alpha^4 x + \alpha^{12} x^2) +$ $\alpha^9 (\alpha^{12} + \alpha^7 x)x$ $= \alpha^6 + \alpha^{11} x + \alpha^3 x^2$ | $B^{(4)}(x) = xB^{(3)}(x)$ $= \alpha^{12} \cdot x + \alpha^7 x^2$ | $\gamma^{(4)} = \gamma^{(3)}$ $= \alpha^{12}$ | $\overline{l}^{(2)} = \overline{l}^{(1)}$ $= 1$ |
| 5 | $\overline{\Delta}^{(5)} = \sum_{j=0}^{l^{(4)}=2} \overline{C}_j^{(4)} S_{5-j}$ $= \overline{C}_0^{(4)} S_5 + \overline{C}_1^{(4)} S_4 + \overline{C}_2^{(4)} S_3$ $= \alpha^6 \cdot 1 + \alpha^5 \cdot \alpha^{13}$ $= \alpha^2$ | $\overline{C}^{(5)}(x) = \gamma^{(4)} \overline{C}^{(4)}(x) - \overline{\Delta}^{(5)} \overline{A}^{(4)}(x)x$ $= \alpha^{12} \cdot (\alpha^6 + \alpha^5 x) +$ $\alpha^2 \cdot (\alpha^{12} x + x^2)x$ $= \alpha^3 + \alpha^2 x + \alpha^{14} x^2 + \alpha^2 x^3$ | $2l^{(4)} = k-1$ $\overline{A}^{(5)}(x) = \overline{C}^{(4)}(x)$ $= \alpha^6 + \alpha^5 x$ | $\overline{D}^{(5)}(x) = \gamma^{(4)} \overline{D}^{(4)}(x) - \overline{\Delta}^{(5)} \overline{B}^{(4)}(x)x$ $= \alpha^{12}(\alpha^6 + \alpha^{11} x + \alpha^3 x^2) +$ $\alpha^2 (\alpha^{12} x + \alpha^7 x^2)x$ $= \alpha^3 + \alpha^8 x + \alpha^3 x^2 + \alpha^9 x^3$ | $B^{(5)}(x) = D^{(4)}(x)$ $= \alpha^6 + \alpha^{11} x + \alpha^3 x^2$ | $\gamma^{(5)} = \overline{\Delta}^{(5)}$ $= \alpha^2$ | $\overline{l}^{(5)} = k - \overline{l}^{(4)}$ $= 3$ |
| 6 | $\overline{\Delta}^{(6)} = \sum_{j=0}^{l^{(5)}=3} \overline{C}_j^{(5)} S_{6-j}$ $= \overline{C}_0^{(5)} S_6 + \overline{C}_1^{(5)} S_5 + \overline{C}_2^{(5)} S_4 + \overline{C}_3^{(5)} S_4$ $= \alpha^3 \cdot \alpha^{11} + \alpha^2 \cdot 1 + \alpha^{14} \cdot \alpha^{11} + \alpha^2 \cdot \alpha^{14}$ $= 0$ | $\overline{C}^{(6)}(x) = \gamma^{(5)} \overline{C}^{(5)}(x) - \overline{\Delta}^{(6)} \overline{A}^{(5)}(x)$ $= (\alpha^3 + \alpha^2 x + \alpha^{14} x^2 +$ $\alpha^2 x^3 \cdot \alpha^2$ $= \alpha^5 + \alpha^4 x + \alpha x^2 + \alpha^4 x^3$ | $2l^{(5)} > k-1$ $\overline{A}^{(6)}(x) = \chi \cdot \overline{A}^{(5)}(x)$ $= \alpha^6 x + \alpha^5 x^2$ | $\overline{D}^{(6)}(x) = \gamma^{(5)} \overline{D}^{(5)}(x) - \overline{\Delta}^{(6)} \overline{B}^{(5)}(x)x$ $= \alpha^2(\alpha^3 + \alpha^8 x + \alpha^3 x^2 +$ $\alpha^9 x^3)$ $= \alpha^5 + \alpha^{10} x + \alpha^5 x^2 + \alpha^{11} x^3$ | $\overline{B}^{(4)}(x) = xB^{(5)}(x)$ $= \alpha^6 \cdot x + \alpha^{11} x^2 + \alpha^3 x^2$ | $\gamma^{(6)} = \gamma^{(5)}$ $= \alpha^2$ | $\overline{l}^{(6)} = \overline{l}^{(5)}$ $= 3$ |

Program Implementation and Simulation Results

The new Reed-Solomon decoding procedure described in the previous section has been verified using a C++ program. The program is implemented to correct v errors for general (n, k) Reed-Solomon codes, where n is of the form $n=2^m-1$, $1 \leq k \leq n-1$, and $0 \leq v \leq \lfloor (n-k)/2 \rfloor$. The error patterns are randomly generated over the positions and magnitudes. An example of simulation results for a (255,223) Reed-Solomon code correcting v errors, where $v \leq 16$, is given in Table 3. For each v, the computation times are in second, which is averaged from the computations of correcting 100 different error patterns. The computation times tend to decrease when the number of errors occurred decrease. This is because of the quantity $\overline{\Delta}^{(k)}$ in Eqs. (24)–(33) is zero.

TABLE 3

New decoding method for (255, 223) RS code. Each entry is the time in second needed for one block computation, which is averaged from 100 computations.

| error | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| time | 0.17 | 0.18 | 0.19 | 0.20 | 0.20 | 0.22 | 0.23 | 0.24 | 0.26 | 0.28 | 0.30 | 0.32 | 0.34 | 0.37 | 0.40 | 0.43 | 0.46 |

A VLSI Design of the Time Domain Reed-Solomon Decoder

Referring now to FIG. 1, the block diagram of a (255,223) Reed-Solomon time domain decoder is shown. The major functional units in this decoder are the syndrome computation unit 12, the modified Berlekamp-Massey algorithm unit 14, the polynomial evaluation unit 16, and the Chien search unit 18. Also, included is a delay register 10, which facilitates synchronization of the decoded message output.

The syndrome computation unit 12 accepts the received sequence of received messages $r_0, r_1, \ldots, r_{254}$ and computes their syndromes.

The sequence of syndromes $S_{32}, \ldots, S_2, S_1$ is shifted serially to the modified Berlekamp-Massey algorithm unit 14. The output of this unit is the modified error locator polynomial $\overline{C}^{(16)}(x) = \beta \cdot \sigma(x)$ and the modified error evaluator polynomial $\overline{D}^{(16)}(x) = \beta \cdot \Omega(x)$, where $\beta = \overline{C}^{(16)}(0)$. The processing of these polynomials is performed by the Chien search unit 18 and the polynomila evaluation unit 16, as discussed below.

Figure 2:
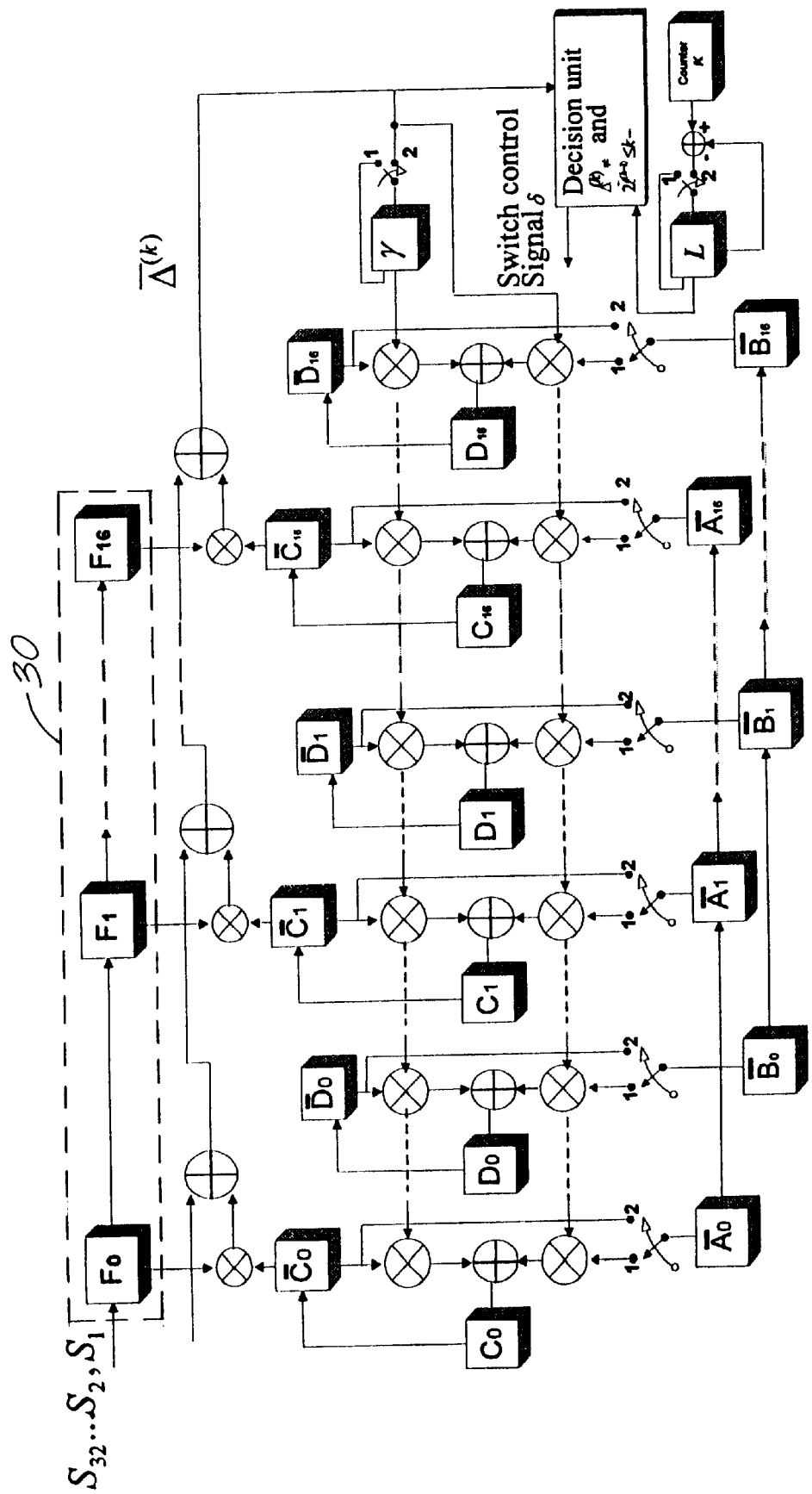
FIG. 2 is a systolic array for computing the modified Berlekamp-Massey algorithm according to the present invention.

Referring now to FIG. 2, the VLSI implementation of this modified Berlekamp-Massey algorithm of the present invention is shown. The only input is the sequence of syndromes $S_{32}, \ldots S_2, S_1$. The maximum order of either polynomial $\overline{C}(x)$ or $\overline{D}(x)$ is $t=32/2=16$. Thus, one needs only $t+1=17$ sub-registers to store syndromes for calculating $\overline{\Delta}^{(k)}$. A register 30 comprises sub-registers $F_0, F_1, \ldots, F_{16}$. That is, $F=(F_0, F_1, \ldots, F_{16})$. Similarly, the registers $\overline{C}=(\overline{C}_0, \overline{C}_1, \ldots, \overline{C}_{16})$ and $\overline{D}=(\overline{D}_0, \overline{D}_1, \ldots, \overline{D}_{16})$ are used to store the coefficients of $\overline{C}(x)$ and $\overline{D}(x)$ given in (24) and (25), respectively. Also, $C=(C_0, C_1, \ldots, C_{16})$ and $D=(D_0, D_1, \ldots, D_{16})$ are the temporary storage of register C and D, respectively. The register $\overline{A}=(\overline{A}_0, \overline{A}_1, \ldots, \overline{A}_{16})$ and $\overline{B}=(\overline{B}_0, \overline{B}_1, \ldots, \overline{B}_{16})$ are used to store the coefficients of $\overline{A}(x)$ and $\overline{B}(x)$ given in (28) and (29), respectively. The registers $\gamma$ and L are used to store the values of $\gamma$ and $\bar{l}$ respectively. Also, there is a decision circuit which generates a control signal $\delta$ to control the switches, and a count K is used to store the updated value of k. The outputs are two sequences out of the contents of registers $\overline{C}$ and $\overline{D}$ following the operations of this structure. The operations of this VLSI structure are described below.

At the initial state, all switches are at position 1. Assume initially in registers that $F=0$, $C=0$, $D=0$, $\overline{C}=1$, $\overline{D}=1$, $\overline{A}=1$ and $\overline{B}=0$. Also, assume the contents in registers $\gamma$, L and K are 1, 0 and 0 respectively. During $k^{th}$ iteration, the contents of counter K is increased by one. Next, the new syndrome is shifted into sub-register $F_l$ and simultaneously the contents in sub-registers $F_i$ are shifted right into subsequent sub-registers $F_{i+l}$ for $i=0,1,2, \ldots, 15$ so that the contents of register F will be timed properly for multiplication with the contents of register $\overline{C}$ for generating $\Delta^{(k)}$. Simultaneously, the contents of registers C and D are loaded into $\overline{C}$ and $\overline{D}$ registers, respectively. Then, the upper logic is activated to compute $\overline{\Delta}^{(k)}$ given in (23) and simultaneously registers $\overline{A}$ and $\overline{B}$ are shifted right by one position to perform $x \cdot \overline{A}^{(k-1)}(x)$ and $x \cdot \overline{B}^{(k-1)}(x)$ respectively. From the known $\overline{\Delta}^{(k)}$, $x \cdot \overline{A}^{(k-1)}$ and $x \cdot \overline{B}^{(k-1)}$, the lower logic is activated to compute $\overline{C}^{(k)}(x)$ and $\overline{D}^{(k)}(x)$ signal stored in registers C and D, respectively. At the same time, the controls signal $\delta$ is calculated. If $\Delta^{(l)}=0$ or $2\bar{l}^{(k-1)} > k-1$, i.e., $\delta=0$, switches are still remain at position 1. Thus, $\gamma^{(k)}$ and $\bar{l}^{(k)}$ in (32) and (38) can be realized and the new updated data of $\gamma^{(k)}$ and $\bar{l}^{(k)}$, i.e., $\gamma^{(k)} = \gamma^{(k-1)}$ and $\bar{l}^{(k)} = \bar{l}^{(k-1)}$ are stored in registers $\gamma$ and L, respectively. If $\Delta^{(k)} \neq 0$ and $2\bar{l}^{(k-1)} \leq k-1$, i.e. $\delta=1$, one moves switches to position 2 so that one replaces the contents of registers $\overline{A}$ and $\overline{B}$ by the contents of registers $\overline{C}$ and $\overline{D}$, respectively. Also, the contents of registers $\gamma$ and L are replaced by $\Delta^{(k)}$ and $k-\bar{l}^{(k-1)}$, respectively. Then, the same procedure is received repeatedly. This sequence of operations stops when the content of register K equals $d-1=32$. Finally, the modified error location polynomial and the modified error evaluation polynomial stored in registers $\overline{C}$ and $\overline{D}$, respectively are obtained.

The register transfer language (RTL) of this inverse-free Berlekamp-Massey algorithm is described as follows:

$T_0$: $F \leftarrow 0$, $C \leftarrow 0$, $D \leftarrow 0$, $\overline{C} \leftarrow 1$, $\overline{D} \leftarrow 1$, $\overline{A} \leftarrow 1$, $B \leftarrow 0$, $\gamma \leftarrow 1$, $L \leftarrow 0$, $K \leftarrow 0$ and all switches are at position 1.

$T_1$: $k \leftarrow k+1$ if $k > d-1 = 32$ stop. Otherwise, $F_0 \leftarrow S_0$ and simultaneously $F_{i+l} \leftarrow F_i$ for $i=1,2, \ldots, 15$, $\overline{C} \leftarrow C = \overline{C}^{(k-1)}(x)$ and $\overline{D} \leftarrow D = \overline{D}^{(k-1)}(x)$ $T_2$: Compute $\overline{\Delta}^{(k)} = \sum_{i=0}^{\bar{l}^{(k)}} \overline{C}_j^{(k-1)} S_{k-j}$, $\overline{A} \leftarrow x \cdot \overline{A}^{(k-1)}$ and $\overline{B} \leftarrow x \cdot \overline{B}^{(k-1)}$ $T_3$: $C \leftarrow \overline{C}^{(k)}(x) = \gamma^{(k-1)} \overline{C} - \overline{\Delta}^{(k)} \overline{A}$, and $D \leftarrow \overline{B}^{(k)}(x) = \gamma^{(k-1)} \overline{B} - \Delta^{(k)} \overline{D}$ $T_4$: If $\delta=0$, go to $T_1$. Otherwise, move all switches to position 2 so that $\overline{A} \leftarrow \overline{C} = \overline{C}^{(k-1)}(x)$, $\overline{B} \leftarrow \overline{D} = \overline{D}^{(k-1)}(x)$, $\gamma \leftarrow \overline{\Delta}^{(k)}$ and $L \leftarrow k - \bar{l}^{(k-1)}$. Then, move all switch to position 1 and go to $T_1$.

One output of the modified Berlekamp-Massey algorithm unit, the modified error locator polynomial $\overline{C}^{16}(x) = \beta \cdot \sigma(x)$ is sent to a Chien search unit for generating a binary sequence of error locations and computing a sequence of $\beta \cdot \sigma'(\alpha^{-255}) \cdot \alpha^{-255}, \ldots, \beta \cdot \sigma'(\alpha^{-1}) \cdot \alpha^{-1}$ simultaneously. In the Chien search method, by [2], one has $$\overline{C}^{16}(\alpha^{-i}) = \beta \cdot \sigma(\alpha^{-i}) = \sum_{j=0}^{16} \beta \cdot \sigma_j \alpha^{-ij} = \sum_{j=0}^{16} \beta \cdot \sigma_j \alpha^{-(i-1)j} \alpha^{-j} \quad (54)$$

for $1 \leq i \leq 255$

By (54), if one multiplies the $j^{th}$ term of $\beta \cdot \sigma(\alpha^{-(i-l)})$ by $\alpha^j$ for $0 \leq j \leq 16$, then one obtains the corresponding term of $\beta \cdot \sigma$ $(\alpha^{-i})$. Thus, one only needs a constant multiplier and a register for computing each term of $\beta \cdot \sigma(\alpha^{-(i-l)})$. In order to facilitate the implementation of the Forney algorithm, $\beta \cdot \sigma$ $(\alpha^{-i})$ in (54) can be separated into the odd and even terms. That is, $$\overline{C}^{(16)}(\alpha^{-i}) = \beta \cdot \sigma(\alpha^{-i}) = \Delta_e(\alpha^{-i}) + \Delta_0(\alpha^{-i}) \text{ for } 1 \leq j \leq 255 \quad (55)$$

where $$\Delta_e(\alpha^{-i}) = \sum_{j=0,2,\ldots}^{16} \beta \cdot \sigma_j \alpha^{-(i-1)j} \alpha^{-j} \quad (56)$$

is the summation of even coefficients and $$\Delta_0(\alpha^{-i}) = \sum_{j=1,3,\ldots}^{16} \beta \cdot \sigma_j \alpha^{-(i-1)j} \alpha^{-j} \quad (57)$$

is the summation of odd coefficients.

The summation of odd coefficients of $\beta \cdot \sigma(\alpha^{-i})$, i.e., $\Delta_0(\alpha^{-i})$ in (57) is equal to $\beta \cdot \sigma(\alpha^{-i})\alpha^{-i}$. That is, $$\Delta_0(\alpha^{-i}) = \beta \cdot \sigma'(\alpha^{-i})\alpha^{-i} = \overline{C}^{(16)}(\alpha^{-i})\alpha^{-i} \text{ for } 1 \leq i \leq 255$$

Figure 3:
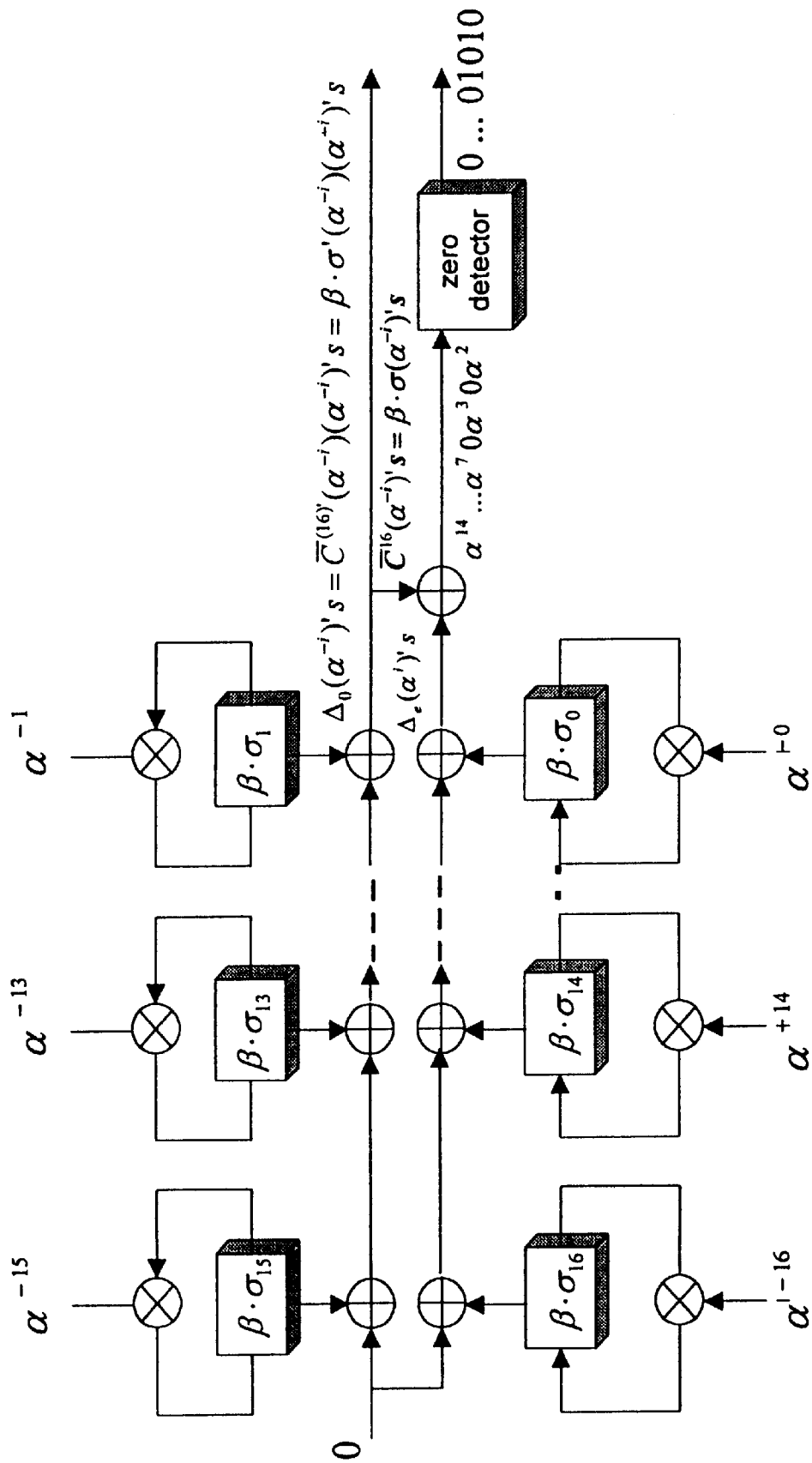
FIG. 3 is a block diagram of a Chien search unit according to the present invention.

Referring you to FIG. 3, the architecture of the Chien search method unit is shown. As shown, the odd and even number terms are summed separately. The architecture of this unit is similar to that of a contemporary Chien search unit, except there are only 17 error locator sub-cells in this (255,223) Reed-Solomon decoder and a zero detector at the end. The zero detector is converted the sequence $\overline{C}^{(16)}(\alpha^{-i})$'s into a sequence of 1's and 0's, where 1 and 0 indicate the occurrence, i.e., $\overline{C}^{(16)}(\alpha^{-l}) = \beta \cdot \sigma(\alpha^{-l}) = 0$, or nonoccurrence, i.e., $\overline{C}_0^{(16)}(\alpha^{-l}) = \beta \cdot \sigma(\alpha^{-l}) \neq 0$, respectively, of and error at a specific inverse location. $\alpha^{-l}$.

The other output of the modified Berlekamnp-Massey algorithm unit, a sequence of the modified error evaluator polynomial $\beta \cdot \Omega(x)$ is sent to the polynomial evaluation unit to perform the evaluation of $\beta \cdot \Omega(x)$. The output of the polynomial evaluation unit $\beta \cdot \Omega(\alpha^{-i})$'s and one output of the Chien search unit, a sequence of $\beta \cdot \sigma'(\alpha^{-255}) \alpha^{-255}, \ldots, \beta \cdot \sigma'(\alpha^{-1})\alpha^{-1}$, are shifted to a finite field divider for computing the sequence of $\Omega(\alpha^{-255})/\alpha^{-255} \cdot \sigma'(\alpha^{-255}), \ldots, \Omega(\alpha^{-1})/\alpha^{-1} \cdot \sigma'(\alpha^{-1})$. The product of the $\Omega(\alpha^{-i})/\alpha^{-i} \cdot \sigma'(\alpha^{-i})$'s and the other output of the Chien search unit, the binary sequence of error locations forms the sequence of the estimated error patterns, i.e., $e_0, e_1, \ldots, e_{254}$. Finally, the estimated code vector is obtained by subtracting the error vector e from the received vector r.

Figure 4:
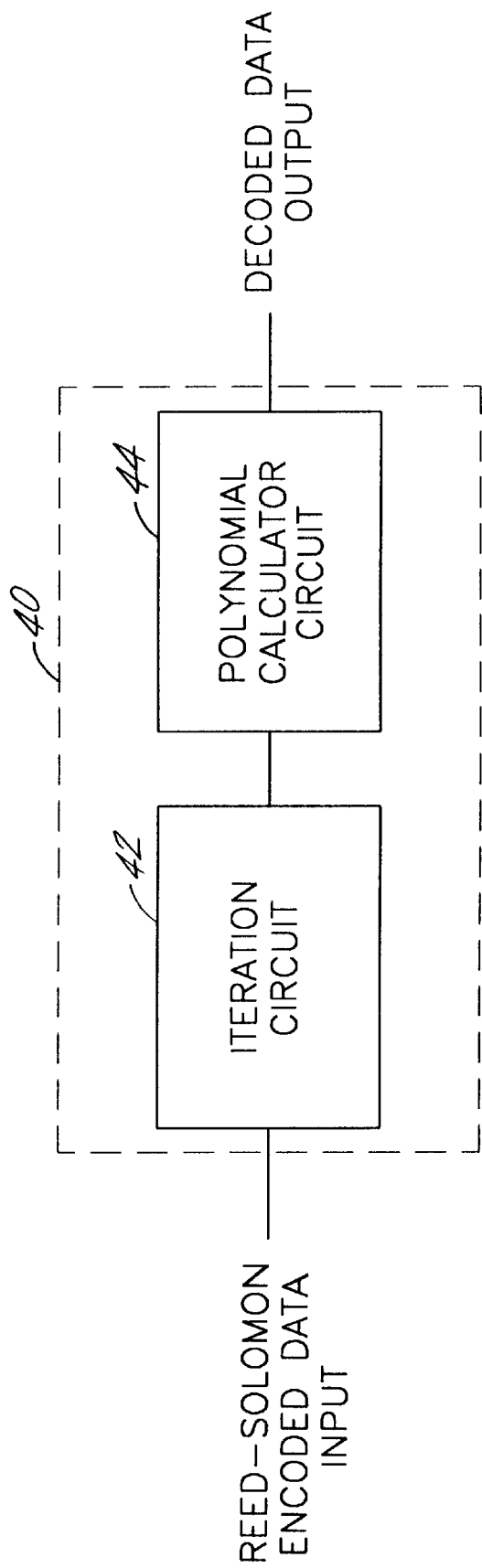
FIG. 4 is a block diagram of the iteration circuit and the polynomial calculation circuit according to a VLSI implementation of the present invention.

Referring now to FIG. 4, a very large scale integrated circuit (VLSI) implementation of the present invention is shown. The VLSI implementation comprises an integrated circuit 40 comprising an iteration circuit 42 which performs iteration according to the modified Berlekamp-Massey algorithm of the present invention and a polynomial calculator circuit 44 which defines the modified error locator polynomial according to equation 44 and also defines a modified error evaluator polynomial according to equation 45.

It is understood that the exemplary algorithm described herein and shown in the drawings represents only a presently preferred embodiment of the invention. Indeed, various modifications and additions may be made to such embodiment without departing from the spirit and scope of the invention. For example, those skilled in the art will appreciate that the algorithm of the present invention is applicable to Reed-Solomon codes having various different sizes. Thus, the description herein of a (225,223) Reed-Solomon code is by way of illustration only, and not by way of limitation. Further, those skilled in the art will appreciate that various different VLSI implementations of the present invention are contemplated. Thus, these and other modifications and additions may be obvious to those skilled in the art and may be implemented to adapt the present invention for use in a variety of different applications.

The following is a C++ program listing of the computer simulation of the algorithm for decoding Reed-Solomon encoded data according to the present invention.

```
//------------------------------------------------------------------------
#include <stdio.h>
#include <stdlib.h>
#include <string.h>
#include <iostream.h>
#include <math.h>
#include <time.h>
#define N      256         // array size, use 16 to save time when possible
#define delimit "------------------------------------------------------"<<endl
#defineDELIMIT"======================================================================"<<endl
//======================================================================
// GF class
//======================================================================
class GF
{
public:
int power;
int symbol;
GF(void);
GF(int pwr, int sym);
~GF(void);
GF operator+(const GF & b) const;
GF operator*(const GF & b) const;
GF inv(void) const;
```

-continued

```
bool operator==(const GF &b) const;
bool operator!=(const GF &b) const;
};
//=============================================================================
// POLY class
//=============================================================================
class POLY
{
public:
GF c[N];
POLY(void);
~POLY(void);
int deg(void) const;
POLY operator*(const GF & b) const;
POLY operator+(const POLY & q) const;
POLY operator*(const POLY & q) const;
//POLY operator/(const POLY & q) const;
POLY operator<<(const int & j) const;
POLY operator>>(const int & j) const;
bool operator==(const POLY & q) const;
POLY lshift(void) const;
POLY rshift(void) const;
POLY diff(void) const;
POLY mod(const int & a) const;
GF eval(const GF & x) const;
void disp(char* title);
};
//=============================================================================
// global variables
//=============================================================================
void init(void);
void gen_GF(void);
void dump(void);
void gen_errata(void);
void Forney_syndromes(void);
void syndromes(void);
void Chien(const POLY & p, int * npt, GF *rtpt);
void s_if_BM_e(void);   // simplified if_BM_e
void POLYdivide(const POLY & p,const POLY & q,POLY & quotient,POLY & remainder);
POLY pdtmoda(const POLY & p,const POLY & q);
POLY pdtmod(const POLY & p,const POLY & q,const int a);
void report(void);
inline double random01( ) {return (double)random(32767)/32767.;}
int n,k,d;      // n,k command line parameters, d=n-k+1
int m;   // number of bits, defined in init( )
int Prim[65];      //2^m, m in [0,64], max 64 bits
GF GFzero,alpha[N];
int s0,t0,b0;
int t,s,v;
int Power_tab[N],Symbl_tab[N];
int Bits[256];
int cnt_s;     // used as a counter for the erasure s
int cnt_t;     // used as a counter for image frame or t
int cnt_b;
int fsize;
POLY POLYzero,POLYone;
POLY g;
POLY erasure,error,errata;
POLY info,cw,r,eccw;
POLY Lambda;   // erasure locator poly
POLY ers_lp;   // erasure locator poly
//POLY sigma;
//POLY tau;
POLY S;
POLY T;
POLY errfound;
int Nor;
GF Roots[N];
int Noe;
GF Errloc[N];
int a;
int Report_flag;
clock_t ck1,ck2,CK1,CK2;
clock_t ct1_alg,ct2_alg,ct_alg;      // collect the time used to compute elp and eep
clock_t ct1_Symd,ct2_Symd,ct_Symd;   // collect the time used for Symdrome
clock_t ct1_Chien,ct2_Chien,ct_Chien;   // collect the time used for Chien
clock_t ct1_Mag,ct2_Mag,ct_Mag;       // collect the time used to compute Magnitude
clock_t ct1_ert,ct2_ert,ct_ert;       // collect the time used to compute Magnitude
double SNR,q2A;       // for modulation
```

-continued

```
//===========================================================================
// methods for GF
//===========================================================================
GF::GF(void)
{
power=n;
symbl=0;
}
//=====================
GF::GF(int pwr,int sym)
{
power=pwr;
symbl=sym;
}
//=====================
GF::~GF(void)
{
}
//=====================
GF GF::operator+(const GF & b) const
{
GF sum;
sum.symbl=symbl^b.symbl;
sum.power=Power_tab[sum.symbl];
return sum;
}
//=====================
GF GF::operator*(const GF & b) const
{
GF pdt;
if(symbl==0 || b.symbl==0) return GFzero;
pdt.power=(power+b.power) % n;
pdt.symbl=Symbl_tab[pdt.power];
return pdt;
}
//=====================
bool GF::operator==(const GF & b) const
{
if (power==b.power && symbl==b.symbl) return true;
else return false;
}
//=====================
bool GF::operator!=(const GF & b) const
{
if (power!=b.power || symbl!=b.symbl) return true;
else return false;
}
//=====================
GF GF::inv(void) const
{
///if(symbl==0) {cout<<"Inversion of GFzero!!!";}
if(power==0) return alpha[0]; else return alpha[n-power];
}
//===========================================================================
// methods for POLY
//===========================================================================
POLY::POLY(void)
{
int i;
for(i=0;i<n;i++) c[i]=GFzero;
}
//=====================
POLY::~POLY(void)
{
}
//=====================
int POLY::deg(void) const
{
int i,deg;
deg=n-1;
for(i=0;i<n;i++)
        {
    if(c[i].symbl==0) deg--; else break;
        }
return deg;
}
//=====================
POLY POLY::operator+(const POLY & q) const
{
```

```
int i;
POLY tmp;
for(i=0;i<n;i++) tmp.c[i]=c[i]+q.c[i];
return tmp;
}
//=====================
POLY POLY::operator*(const POLY & q) const
{
POLY tmp,sum;
int i;
for(i=0;i<n;i++) tmp.c[n-1-i]=c[n-1-i];
for(i=0;i<=q.deg( );i++)
        {
        sum=sum+tmp*q.c[(n-1)-i];
        tmp=tmp.lshift( );
        }
return sum;
}
//=====================
POLY POLY::operator*(const GF & b) const
{
POLY tmp;
int i;
for(i=0;i<=deg( );i++) tmp.c[n-1-i]=c[n-1-i]*b;
return tmp;
}
//=====================
bool POLY::operator==(const POLY & q) const
{
int i;
for(i=0;i<n;i++)
        {
    if(c[i]==q.c[i]) continue;
            else return false;
        }
return true;
}
//=====================
POLY POLY::operator<<(const int & j) const
{
POLY tmp;
int i;
for(i=0;i<n-j;i++) tmp.c[i]=c[i+j];   // the reset components are FGzero?????
return tmp;
}
//=====================
POLY POLY::operator>>(const int & j) const
{
POLY tmp;
int i;
for(i=0;i<n-j;i++) tmp.c[n-1-i]=c[n-1-(i+j)]; // the reset components are FGzero
return tmp;
}
//=====================
POLY POLY::lshift( ) const
{
POLY tmp;
int i;
for(i=0;i<n-1;i++) tmp.c[i]=c[i+1];
tmp.c[n-1]=c[0];
return tmp;
}
//=====================
POLY POLY::rshift( ) const
{
POLY tmp;
int i;
tmp.c[0]=c[n-1];
for(i=1;i<n;i++) tmp.c[i]=c[i-1];
return tmp;
}
//=====================
POLY POLY::diff(void) const
{
POLY tmp;
int i;
for(i=n-1;i>=0;i=i-2) tmp.c[i]=GFzero;
for(i=n-2;i>=0;i=i-2) tmp.c[i]=c[i];
tmp=tmp.rshift( );
```

-continued

```
return tmp;
}
//======================
POLY POLY::mod(const int & a) const
{
POLY tmp;
int i;
tmp;
for(i=0;i<a;i++) tmp.c[n-1-i]=c[n-1-i];
//for(i=0;i<n;i++)
//           {
//           j=(n-1)-((n-1-i) % a);
//           tmp.c[j]=tmp.c[j]+c[i];
//           }
return tmp;
}
//======================
GF POLY::eval(const GF & x) const
{
int i;
GF sum;
sum=c[n-1-deg( )];
for(i=deg( )-1;i>=0;i--) sum=sum*x+c[n-1-i];
return sum;
}
//======================
void POLY::disp(char* title)
{
int i;
if(n>15) return;
cout.width(9);cout << title;
cout<<":(";
for(i=0;i<n-1;i++)
           {
           if(c[i].power==n) cout<<"--";
           else
               {
               cout.width(2);
               cout << c[i].power;
               }
           cout << ",";
           }
if(c[i].power==n) cout<<"--";
else
       {
       cout.width(2);
       cout << c[i].power;
       }
cout<<")"<<endl;
}
//========================================================================
// init : gen_GF, randomize?
//========================================================================
void init(void)
{
if(n== 8-1) m=3;
if(n== 16-1) m=4;
if(n== 32-1) m=5;
if(n== 64-1) m=6;
if(n==128-1) m=7;
if(n==256-1) m=8;
gen_GF( );
T=POLYzero;
//randomize( );      // seeding the random numbers
}
//========================================================================
// generate the Galois field
//========================================================================
void gen_GF( )
{
int i;
int tester;        // overflow testing
Prim[4]=0x13;      //(    1 0011)=x^4+x+1
Prim[6]=0x43;      //(  100 0011)=x^6+x+1
Prim[8]=0x11d;     //(1 0001 1101)=x^8+x^4+x^3+x^2+1
tester=1<<m;       //(1 0000), for m=4, for testing if x^4 exists
//int sym_tab[16]={1, 2, 4, 8, 3, 6, 12,11, 5,10, 7,14,15,13, 9, 0};
int sym_tab[N];
sym_tab[0]=1;
```

-continued

```
sym_tab[n]=0;
for(i=1;i<n;i++)    // construct the sym table
        {
        sym_tab[i]=sym_tab[i-1]<<1;
        if(sym_tab[i] & tester) sym_tab[i]^=Prim[m];
        }
for(i=0;i<=n;i++) Symbl_tab[i]=sym_tab[i];
for(i=0;i<=n;i++) Power_tab[Symbl_tab[i]]=i;
//for(i=0;i<=n;i++) cout<<Power_tab[i]<<" ";cout<<endl;
for(i=0;i<=n;i++) alpha[i]=GF(i,Symbl_tab[i]);
GFzero=alpha[n];    // zero in the field GF
for(i=0;i<=n;i++) POLYzero.c[i]=GFzero;   // zero poly
POLYone=POLYzero; POLYone.c[n-1-0]=alpha[0];
g=POLYzero;
g.c[n-1]=alpha[0];
POLY tmp;
tmp.c[n-2]=alpha[0];
for(i=1;i<=d-1;i++)
        {
    tmp.c[n-1]=alpha[i];
    g=g*tmp;
    //g.disp("genPOLY");
        }
}
//===========================================================================
// errata pattern generator
// s, t,
// erasure locator poly,
// erasure, error and errata=erasure+error are generated
//===========================================================================
void gen_errata(void)
{
int i,j,loc[N],mag[N];
POLY tmp_poly;
randomize();
// random patters
// random s and t
if(t0==-1 && s0==-1)
        {
        s=65535;t=65536;
        while((s+2*t)>(d-1))
            {
            s=d*rand()/RAND_MAX;
            t=(d/2+1)*rand()/RAND_MAX;
            }
        }
else
{
        // looping s and t, random are not used
        s=cnt_s;
        t=cnt_t;
}
// gen the locations for errata, no repeated
loc[0]=n*rand()/RAND_MAX;   // max returned is n-1
for(i=1;i<s+t;i++)
        {
        loc[i]=n*rand()/RAND_MAX;
        for(j=0;j<i;j++) if(loc[j]==loc[i]) --i;
        }
// erasure locator poly
ers_lp=POLYzero; ers_lp.c[n-1]=alpha[0];
tmp_poly=POLYzero;
for(i=0;i<s;i++)
        {
        tmp_poly.c[n-1]=alpha[0];
        tmp_poly.c[n-1-1]=alpha[loc[i]];
        ers_lp=ers_lp*tmp_poly;
        }
Lambda=ers_lp; // tmp used erasure loc poly in if_BM_ee
// generate the magnitudes for errata
// BYTE-wise magnitude
for(i=0;i<s+t;i++) mag[i]=n*rand()/RAND_MAX;   // gen the magnitudes
// BIT-wise magnitude a^0,a^1,...,a^7
//for(i=0;i<s+t;i++) mag[i]=m*rand()/RAND_MAX;  // gen the magnitudes
// finally, the erasure, error and errata
erasure=POLYzero;
error=POLYzero;
for(i=0;i<s;i++) erasure.c[n-1-loc[i]]=alpha[mag[i]];      // the erasure
for(i=s;i<s+t;i++) error.c[n-1-loc[i]]=alpha[mag[i]];      // the error
```

```
errata=erasure+error;
// disp the errata pattern
if(Report_flag)
        {
        cout<<"erasure="<<s<<":";
        for(i=0;i<s;i++)
            cout<<"("<<loc[i]<<","<<erasure.c[n-1-loc[i]].power<<") ";
        cout<<endl;
        cout<<"error  ="<<t<<":";
        for(i=s;i<s+t;i++)
    cout<<"("<<loc[i]<<","<<error.c[n-1-loc[i]].power<<") ";
        cout<<endl;
        }
}
//==========================================================================
// compute the syndromes
//==========================================================================
void syndromes(void)
{
int j;
S=POLYzero;
for(j=1;j<=d-1;j++) S.c[n-1-j]=r.eval(alpha[j]);
}
//==========================================================================
// compute the Forney syndromes from Lambda and S
//==========================================================================
void Forney_syndromes(void)
{
ing i,j;
GF sum;
T=POLYzero;
for(j=1;j<=d-1-s;j++)
        {
        sum=GFzero;
        for(i=0;i<=s;i++) sum=sum+Lambda.c[(n-1)-i]*S.c[(n-1)-(j+s-i)];
        T.c[n-1-j]=sum;
        }
}
//==========================================================================
// Chien's search
// no GFzero roots, no repeated roots
//==========================================================================
void Chien(const POLY & p, int *npt, GF *rtpt)
{
POLY ptmp,pdiv,pquot,prmnd;
int i;
*npt=0;
Nor=0;
for(i=0;i<n;i++) Roots[i]=GFzero;
for(i=0;i<n;i++)
        {
        if(p.eval(alpha[i])==GFzero)
            {
            Roots[Nor++]=alpha[i];
            ///pdiv=POLYzero;
            ///pdiv.c[n-1]=alpha[i];
            ///pdiv.c[n-2]=alpha[0];
            ///ptmp=p;
            ///while(1)
                ///{
                    ///POLYdivide(ptmp,pdiv,pquot,prmnd);
                    ///if(prmnd==POLYzero && pquot.eval(alpha[i])==GFzero)
                ///    {
                ///    cout<<"repeated roots "<<endl;
                    /// Roots[Nor++]=alpha[i];
                ///    ptmp=pquot;
                ///    }
                ///  else break;
                ///}
            }
        }
//if(p.eval(alpha[0]).symbl==0) Roots[Nor++]=alpha[0];
}
//==========================================================================
// the devision of 2 POLY, quotient and remainder are returned
//==========================================================================
void POLYdivide(const POLY & p,const POLY & q,POLY & quotient,POLY & remainder)
{
POLY tmpq;
```

-continued

```
GF leadcoef;
int deg,degp,degq;
quotient=POLYzero;
remainder=p;
degp=p.deg( );
degq=q.deg( );
//cout<<"---dividing------------------------------"<<endl;
//cout<<"degp="<<degp<<" degq="<<degq<<endl;
if(degp<degq) return;
leadcoef=q.c[n-1-degq];     // make q monic
//cout<<"leadcoef="<<leadcoef.power<<endl;
tmpq=q*leadcoef.inv( );
//quotient.disp("quotient");
//remainder.disp("remaind");
for(deg=degp-degq;deg>=0;deg--)
         {
         // pick the leading coef as the devision since tmpq is monic
         quotient.c[n-1-deg]=remainder.c[n-1-(deg+degq)];
         //((tmpq<<deg)*remainder.c[n-1-(deg+degq)]).disp("shifted");
         remainder=remainder+(tmpq<<deg)*remainder.c[n-1-(deg+degq)];
         //quotient.disp("quotient");
         //remainder.disp("remaind");
         }
quotient=quotient*leadcoef.inv( );   // Un-make the monic
//(quotient*q+remainder+p).disp("divcheck");
//cout<<"---divided------------------------------"<<endl;
return;
}
//==========================================================================
// the product of 2 POLY mod a
//==========================================================================
POLY pdtmoda(const POLY & p,const POLY & q)
{
POLY sum;
int i,j;
sum;
for(i=0;i<a;i++)
         for(j=0;j<a-i;j++)
                  sum.c[n-1-(i+j)]=sum.c[n-1-(i+j)]+p.c[n-1-i]*q.c[n-1-j];
return sum;
}
//==========================================================================
// the product of 2 POLY mod a
//==========================================================================
POLY pdtmod(const POLY & p,const POLY & q,const int a)
{
POLY sum;
int i,j;
sum=POLYzero;
for(i=0;i<a;i++)
         for(j=0;j<a-i;j++)
                  sum.c[n-1-(i+j)]=sum.c[n-1-(i+j)]+p.c[n-1-i]*q.c[n-1-j];
return sum;
}
//==========================================================================
// Compute the error polynominal, output is errfound
// s_if_BM_e        : simplified if_BM_e, locator and evaluator are computed
//                    simultaneously.
//==========================================================================
void s_if_BM_e(void)
{
int i,j,kk;
POLY Cb,Db,Ab,Bb;
POLY Cb_1,Db_1,Ab_1,Bb_1;     // previous data
POLY Cb_prime;
int Lb,Lb_1;
GF gammab,gammab_1;
GF deltab;
GF beta;
POLY sigma,Omega;
GF tmp,tmp_inv;
POLY Y;
//cout<<"Welcome to s_if_BM_e decoder!!!"<<endl;
// the syndromes
syndromes( );
// starting the BM
ct1_alg=clock( );
//kk=0;
Cb=POLYzero; Cb.c[n-1]=alpha[0];
```

-continued

```
Db=POLYzero;Db.c[n-1]=alpha[0];
Ab=POLYzero;Ab.c[n-1]=alpha[0];
Bb=POLYzero;
Lb=0;
gammab=alpha[0];
/*
cout<<"k="<<kk<<" "<<"deltabar="<<deltab.power<<endl;
Cb.disp("Cbar");
Ab.disp("Abar");
Db.disp("Dbar");
Bb.disp("Bbar");
cout<<"gammabar="<<gammab.power<<" "<<"Lbar="<<Lb<<endl<<endl;
*/
for(kk=1;kk<=d-1-s;kk++)
        {
    Ab__1=Ab;
    Bb__1=Bb;
    Cb__1=Cb;
    Db__1=Db;
Lb__1=Lb;
gammab__1=gammab;
        deltab=GFzero;
        for(j=0;j<=Lb__1;j++) deltab=deltab+Cb__1.c[(n-1)-j]*S.c[(n-1)-(kk-j)];
Cb=Cb__1*gammab+Ab__1.lshift( )*deltab;
Db=Db__1*gammab+Bb__1.lshift( )*deltab;
        if(deltab==GFzero || 2*Lb>kk-1)
            {
    Ab=Ab__1.lshift( );
    Bb=Bb__1.lshift( );
    Lb=Lb__1;
    gammab=gammab__1;
    }
        else
                {
    Ab=Cb__1;
    Bb=Db__1;
    Lb=kk-Lb__1;
    gammab=deltab;
                }
/*
cout<<"k="<<kk<<" "<<"deltabar="<<deltab.power<<endl;
Cb.disp("Cbar");
Ab.disp("Abar");
Db.disp("Dbar");
Bb.disp("Bbar");
cout<<"gammabar="<<gammab.power<<" "<<"Lbar="<<Lb<<endl;
cout<<endl;
*/
        }
ct2__alg=clock( );
ct__alg+=(ct2__alg-ct1__alg);
// using Chien's search to find the roots of sigma
Chien(Cb,&Nor,Roots);
Noe=Nor;
for(i=0;i<Noe;i++) Errloc[i]=Roots[i].inv( ); // inverse locations
//cout<<"Chien's search : Nor="<<Nor<<" : ";
//for(i=0;i<Nor;i++) cout<<Errloc[i].power<<" ";cout<<endl;
// the error values and the error polynominal Y
Cb__prime=Cb.diff( );
for(i=0;i<Nor;i++)
        {
        tmp=Errloc[i];
        tmp__inv=Errloc[i].inv( );
        Y.c[n-1-tmp.power]=
    Db.eval(tmp__inv)*(Cb__prime.eval(tmp__inv)*tmp__inv).inv( );
        }
errfound=Y;
}
//=====================================================================
// report
//=====================================================================
void report(void)
{
if(Report__flag)
        {
        info.disp("Info");
        cw.disp("Codeword");
        erasure.disp("erasure");
        error.disp("error");
```

-continued

```
                r.disp("Received");
                Lambda.disp("Lambda");
                S.disp("Syndrome");
                T.disp("Forney");
                cout<<endl;
                errata.disp("Errata");
                errfound.disp("ErrFound");
                eccw.disp("ErrCrrted");
                cout<<endl;
            }
    if((cw+eccw)==POLYzero)
            {
                if(Report_flag) cout<<"Error corrected!!! "<<endl;
            }
    else
            {
                cout<<"Error NOT corrected ************************************"<<endl;
                errata.disp("Errata");
                S.disp("syndrome");
                (cw+eccw).disp("wrong?");
            }
    if(Report_flag) cout<<DELIMIT;
}
//==========================================================================
// Dump some global data
//==========================================================================
void dump(void)
{
int i;
GF tmp;
//global parameters
cout<<"n="<<n<<" k="<<k<<" d="<<d<<" m="<<m<<endl;
cout<<"Primitive"<<Prim[m]<<endl;
// alpha
for(i=0;i<n+1;i++) cout << alpha[i].power << " " <<alpha[i].symbl <<"\n";
cout << endl;
//addition and multiplication table
//for(j=0;j<n+1;j++)
//      for(i=0;i<n+1;i++)
//          {
//          tmp=alpha[i]+alpha[j];
//          cout << alpha[i].power << " + " <<alpha[j].power << " = " << tmp.power <<"\t";
//          cout << alpha[i].symbl << " + " << alpha[j].symbl << " = " <<tmp.symbl <<"\t";
//          if ((i % 2) ==0) cout << endl;
//          }
//cout <<endl << endl;
//for(j=0;j<n+1;j++)
//      for(i=0;i<n+1;i++)
//          {
//          tmp=alpha[i]*alpha[j];
//          cout << alpha[i].power << " * " << alpha[j].power << " = " << tmp.power <<"\t";
//          cout << alpha[i].symbl << " * " << alpha[j].symbl << " = " << tmp.symbl <<"\t";
//          if ((i % 2) ==0) cout << endl;
//          }
//cout<<endl;
}
int main(int argc, char * argv[ ])
{
char method[80];
int start_s,end_s,start_t,end_t,start_b,end_b;
POLY quotient,remainder;
if(argc==1)
            {
                cout<<"ecc n  k  method     s  t  blocks Rpt"<<endl;
                cout<<"ecc 255 239 s_if_BM_e 0 3 100 0"<<endl;
                cout<<"Report_flag=0,1,2"<<endl<<endl;
                exit(0);
            }
n=atoi(argv[1]);
k=atoi(argv[2]);
d=n-k+1;
strcpy(method,argv[3]);
s0=atoi(argv[4]);
            start_s=s0; end_s=s0;
                if(s0==999) {start_s=0; end_s=d-1;}         // all
        if(s0==-1) {start_s=0; end_s=0;}         // randomized
t0=atoi(argv[5]);
            start_t=t0; end_t=t0;
                if(t0==999) start_t=0;           // end_t=(d-1-s)/2; moved to the loops
```

-continued

```
    if(t0==-1) {start_t=0; end_t=0;}
b0=atoi(argv[6]);
            start_b=1; end_b=b0;
Report_flag=atoi(argv[7]);
//==========================================================================
init( );
cout<<DELIMIT;
cout<<"RS("<<n<<","<<kk<<") "<<method<<" d="<<d<<" m="<<m<<endl;
cout<<DELIMIT;
cout<<endl<<endl;
cout<<" s t Blocks GenErt Syndrm Algthm Chiens Magntd TotalT"<<endl;
cout<<DELIMIT;
//==========================================================================
CK1=clock( );       // global timer
for(cnt_s=start_s;cnt_s<=end_s;cnt_s++)
{
if(t0==999) end_t=(d-1-cnt_s)/2;
for(cnt_t=start_t;cnt_t<=end_t;cnt_t++)
{
ck1=clock( );
for(cnt_b=start_b;cnt_b<=end_b;cnt_b++)
{
//==========================================================================
// get an info from the array image, which is from a file
info=POLYzero;
cw=POLYzero;
POLYdivide(info,g,quotient,remainder);
cw=info+remainder;
//==========================================================================
// add the errata pattern
ct1_ert=clock( );
gen_errata( );
ct2_ert=clock( );
ct_ert+=(ct2_ert-ct1_ert);
r=cw+errata;
// RS decoder
// output is errfound
s_if_BM_e( );
// error corrected code word eccw = received + error found
eccw=r+errfound;
report( );
}               // count the blocks
ck2=clock( );             // block timing
cout.width(3);cout<<s;
cout.width(3);cout<<t;
cout.width(8);cout<<b0;
cout.width(8);cout<<ct_ert;
cout.width(8);cout<<ct_Symd;
cout.width(8);cout<<ct_alg;
cout.width(8);cout<<ct_Chien;
cout.width(8);cout<<ct_Mag;
cout.width(8);cout<<(ck2-ck1)<<endl;
ct_ert=0;
ct_alg=0;
ct_Symd=0;
ct_Chien=0;
ct_Mag=0;
if(Report_flag) cout<<DELIMIT;
}               // count cnt_t
}               // count cnt_s
CK2=clock( );             // global timing
if(Report_flag==0) cout<<DELIMIT;
cout<<"Total time=";cout.width(5);cout<<(CK2-CK1)<<endl<<endl;
return 0;
}
```

What is claimed is:

1. A method of using a general purpose computer to correct errors in data stored using Reed-Solomon encoding by solving an error locator polynomial and an error evaluator polynomial using the step of iterating without performing polynomial division and inverses during iteration, wherein the step of iterating comprises:

a. using a general purpose computer to initially define:

$\overline{C}^{(0)}(x)=1$, $\overline{D}^{(0)}(x)=1$, $\overline{A}^{(0)}(x)=1$, $\overline{B}^{(0)}(x)=0$, $\overline{l}^{(0)}=0$, $\gamma^{(k)}=1$ if $k \leq 0$;

b. using a general purpose computer to set k=k+1 If k=d-1, otherwise, defining $$\overline{\Delta}^{(k)} = \sum_{j=0}^{T^{(k-1)}} \overline{c}_j^{(k-1)} s_{k-j}; \quad (23)$$

c. and using a general purpose computer to let $$\overline{C}^{(k)}(x) = \gamma^{(k-1)}\overline{C}^{(k-1)}(x) - \overline{\Delta}^{(k)}\overline{A}^{(k-1)}(x) \cdot x \quad (24)$$

$$\overline{D}^{(k)}(x) = \gamma^{(k-1)}\overline{D}^{(k-1)}(x) - \overline{\Delta}^{(k)}\overline{B}^{(k-1)}(x) \cdot x^{14} \quad (25)$$

$$\overline{A}^{(k)}(x) = \begin{cases} x \cdot \overline{A}^{(k-1)}(x), & \text{if } \overline{\Delta}^{(k)} = 0 \text{ or if } 2\overline{l}^{(k-1)} > k-1 \\ \overline{C}^{(k-1)}(x), & \text{if } \overline{\Delta}^{(k)} \neq 0 \text{ and } 2\overline{l}^{(k-1)} \leq k-1 \end{cases} \quad (26), (27)$$

$$\overline{B}^{(k)}(x) = \begin{cases} x \cdot \overline{B}^{(k-1)}(x), & \text{if } \overline{\Delta}^{(k)} = 0 \text{ or if } 2\overline{l}^{(k-1)} > k-1 \\ \overline{D}^{(k-1)}(x), & \text{if } \overline{\Delta}^{(k)} \neq 0 \text{ and } 2\overline{l}^{(k-1)} \leq k-1 \end{cases} \quad (28) (29)$$

$$\overline{l}^{(k)}(x) = \begin{cases} \overline{l}^{(k-1)}, & \text{if } \overline{\Delta}^{(k)} = 0 \text{ or if } 2\overline{l}^{(k-1)} > k-1 \\ k - \overline{l}^{(k-1)}(x), & \text{if } \overline{\Delta}^{(k)} \neq 0 \text{ and } 2\overline{l}^{(k-1)} \leq k-1 \end{cases} \quad (30) (31)$$

$$\gamma^{(k)} = \begin{cases} \gamma^{(k-1)}, & \text{if } \overline{\Delta}^{(k)} = 0 \text{ or if } 2\overline{l}^{(k-1)} > k-1 \\ \overline{\Delta}^{(k)}, & \text{if } \overline{\Delta}^{(k)} \neq 0 \text{ and } 2\overline{l}^{(k-1)} \leq k-1 \end{cases} ; \quad (32) (33)$$

and d. repeating step (a).

2. A method of using a general purpose computer to correct errors in data stored using Reed-Solomon encoding by solving an error locator polynomial and an error evaluator polynomial using the step of iterating without performing polynomial division and inverses during iteration, comprising the steps of:

a. using a general purpose computer to determine an error locator polynomial according to the equation:

$$\sigma(x) = \frac{\overline{C}^{(d-1)}(x)}{\beta}; \quad (47)$$

and b. using a general purpose computer to determine an error evaluator polynomial according to the equation:

$$P(x) = \Omega(x) - \sigma(x) = \frac{\overline{D}^{(d-1)}(x)}{\beta} - \sigma(x). \quad (48)$$

3. A method for correcting errors in data stored using Reed-Solomon encoding, the method comprising the step of using a dedicated circuit to iterate without performing polynomial division and inverses during iteration, wherein the step of iterating comprises:

a. using a dedicated circuit to initially define:

$$\overline{C}^{(0)}(x)=1, \overline{D}^{(0)}(x)=1, \overline{A}^{(0)}(x)=1, \overline{B}^{(0)}(x)=0, \overline{l}^{(0)}=0,$$

$$\gamma^{(k)}=1 \text{ if } k\leq 0;$$

b. using a dedicated circuit to set k=k+1 if k=d−1, otherwise, defining $$\overline{\Delta}^{(k)} = \sum_{j=0}^{\overline{l}^{(k-1)}} \overline{c}_j^{(k-1)} s_{k-j}; \quad (23)$$

c. and using a dedicated circuit to let $$\overline{C}^{(k)}(x) = \gamma^{(k-1)}\overline{C}^{(k-1)}(x) - \overline{\Delta}^{(k)}\overline{A}^{(k-1)}(x) \cdot x \quad (24)$$

$$\overline{D}^{(k)}(x) = \gamma^{(k-1)}\overline{D}^{(k-1)}(x) - \overline{\Delta}^{(k)}\overline{B}^{(k-1)}(x) \cdot x^{14} \quad (25)$$

$$\overline{A}^{(k)}(x) = \begin{cases} x \cdot \overline{A}^{(k-1)}(x), & \text{if } \overline{\Delta}^{(k)} = 0 \text{ or if } 2\overline{l}^{(k-1)} > k-1 \\ \overline{C}^{(k-1)}(x), & \text{if } \overline{\Delta}^{(k)} \neq 0 \text{ and } 2\overline{l}^{(k-1)} \leq k-1 \end{cases} \quad (26) (27)$$

$$\overline{B}^{(k)}(x) = \begin{cases} x \cdot \overline{B}^{(k-1)}(x), & \text{if } \overline{\Delta}^{(k)} = 0 \text{ or if } 2\overline{l}^{(k-1)} > k-1 \\ \overline{D}^{(k-1)}(x), & \text{if } \overline{\Delta}^{(k)} \neq 0 \text{ and } 2\overline{l}^{(k-1)} \leq k-1 \end{cases} \quad (28) (29)$$

$$\overline{l}^{(k)}(x) = \begin{cases} \overline{l}^{(k-1)}, & \text{if } \overline{\Delta}^{(k)} = 0 \text{ or if } 2\overline{l}^{(k-1)} > k-1 \\ k - \overline{l}^{(k-1)}, & \text{if } \overline{\Delta}^{(k)} \neq 0 \text{ and } 2\overline{l}^{(k-1)} \leq k-1 \end{cases} \quad (30) (31)$$

$$\gamma^{(k)} = \begin{cases} \gamma^{(k-1)}, & \text{if } \overline{\Delta}^{(k)} = 0 \text{ or if } 2\overline{l}^{(k-1)} > k-1 \\ \overline{\Delta}^{(k)}, & \text{if } \overline{\Delta}^{(k)} \neq 0 \text{ and } 2\overline{l}^{(k-1)} \leq k-1; \end{cases} \quad (32) (33)$$

and d. repeating step (a).

4. A method for correcting errors in data stored using Reed-Solomon encoding, the method comprising the step of using a dedicated circuit to iterate without performing polynomial division and inverses during iteration, comprising the steps of:

a. using a dedicated circuit to determine an error locator polynomial according to the equation:

$$\sigma(x) = \frac{\overline{C}^{(d-1)}(x)}{\beta}; \quad (47)$$

and b. using a dedicated circuit to determine an error evaluator polynomial according to the equation:

$$P(x) = \Omega(x) - \sigma(x) = \frac{\overline{D}^{(d-1)}(x)}{\beta} - \sigma(x). \quad (48)$$

5. A general purpose computer for correcting errors in data stored using Reed-Solomon encoding, the general purpose computer being configured to solve an error locator polynomial and an error evaluator polynomial by iteration without performing polynomial division and inverses during iteration, wherein the general purpose computer is configured to:

a. initially define:

$$\overline{C}^{(0)}(x)=1, \overline{D}^{(0)}(x)=1, \overline{A}^{(0)}(x)=1, \overline{B}^{(0)}(x)=0, \overline{l}^{(0)}=0,$$

$$\gamma^{(k)}=1 \text{ if } k\leq 0;$$

b. set k=k+1 if k=d−1, otherwise, defining $$\overline{\Delta}^{(k)} = \sum_{j=0}^{\overline{l}^{(k-1)}} \overline{c}_j^{(k-1)} s_{k-j}; \quad (23)$$

c. and let $$\overline{C}^{(k)}(x) = \gamma^{(k-1)}\overline{C}^{(k-1)}(x) - \overline{\Delta}^{(k)}\overline{A}^{(k-1)}(x) \cdot x \quad (24)$$

$$\overline{D}^{(k)}(x) = \gamma^{(k-1)}\overline{D}^{(k-1)}(x) - \overline{\Delta}^{(k)}\overline{B}^{(k-1)}(x) \cdot x^{14} \quad (25)$$

$$\overline{A}^{(k)}(x) = \begin{cases} x \cdot \overline{A}^{(k-1)}(x), & \text{if } \overline{\Delta}^{(k)} = 0 \text{ or if } 2\overline{l}^{(k-1)} > k-1 \quad (26) \\ \overline{C}^{(k-1)}(x), & \text{if } \overline{\Delta}^{(k)} \neq 0 \text{ and } 2\overline{l}^{(k-1)} \leq k-1 \quad (27) \end{cases}$$

$$\overline{B}^{(k)}(x) = \begin{cases} x \cdot \overline{B}^{(k-1)}(x), & \text{if } \overline{\Delta}^{(k)} = 0 \text{ or if } 2\overline{l}^{(k-1)} > k-1 \quad (28) \\ \overline{D}^{(k-1)}(x), & \text{if } \overline{\Delta}^{(k)} \neq 0 \text{ and } 2\overline{l}^{(k-1)} \leq k-1 \quad (29) \end{cases}$$

$$\overline{l}^{(k)}(x) = \begin{cases} \overline{l}^{(k-1)}, & \text{if } \overline{\Delta}^{(k)} = 0 \text{ or if } 2\overline{l}^{(k-1)} > k-1 \quad (30) \\ k - \overline{l}^{(k-1)}(x), & \text{if } \overline{\Delta}^{(k)} \neq 0 \text{ and } 2\overline{l}^{(k-1)} \leq k-1 \quad (31) \end{cases}$$

$$\gamma^{(k)} = \begin{cases} \gamma^{(k-1)}, & \text{if } \overline{\Delta}^{(k)} = 0 \text{ or if } 2\overline{l}^{(k-1)} > k-1 \quad (32) \\ \overline{\Delta}^{(k)}, & \text{if } \overline{\Delta}^{(k)} \neq 0 \text{ and } 2\overline{l}^{(k-1)} \leq k-1 \quad (33) \end{cases};$$

and d. repeat step (a).

6. A general purpose computer for correcting errors in data stored using Reed-Solomon encoding, the general purpose computer being configured to solve an error locator polynomial and an error evaluator polynomial by iteration without performing polynomial division and inverses during iteration, wherein the general purpose computer is configured to:

a. determine an error locator polynomial according to the equation:

$$\sigma(x) = \frac{\overline{C}^{(d-1)}(x)}{\beta}; \quad (47)$$

and b. determine an error evaluator polynomial according to the equation:

$$P(x) = \Omega(x) - \sigma(x) = \frac{\overline{D}^{(d-1)}(x)}{\beta} - \sigma(x). \quad (48)$$

7. A device comprising a dedicated circuit configured to correct errors in data stored using Reed-Solomon encoding, a dedicated circuit configured to solve an error locator polynomial and an error evaluator polynomial by iteration without performing polynomial division and inverses during iteration, and further comprising a dedicated circuit configured to:

a. initially define:

$$\overline{C}^{(0)}(x)=1, \overline{D}^{(0)}(x)=1, \overline{A}^{(0)}(x)=1, \overline{B}^{(0)}(x)=0, \overline{l}^{(0)}=0,$$

$\gamma^{(k)}=1$ if $k \leq 0$;

b. set k=k+1 if k=d−1, otherwise, defining $$\overline{\Delta}^{(k)} = \sum_{j=0}^{\overline{l}^{(k-1)}} \overline{c}_j^{(k-1)} s_{k-j}; \quad (23)$$

c. and let $$\overline{C}^{(k)}(x) = \gamma^{(k-1)}\overline{C}^{(k-1)}(x) - \overline{\Delta}^{(k)}\overline{A}^{(k-1)}(x) \cdot x \quad (24)$$

$$\overline{D}^{(k)}(x) = \gamma^{(k-1)}\overline{D}^{(k-1)}(x) - \overline{\Delta}^{(k)}\overline{B}^{(k-1)}(x) \cdot x \quad (25)$$

$$\overline{A}^{(k)}(x) = \begin{cases} x \cdot \overline{A}^{(k-1)}(x), & \text{if } \overline{\Delta}^{(k)} = 0 \text{ or if } 2\overline{l}^{(k-1)} > k-1 \quad (26) \\ \overline{C}^{(k-1)}(x), & \text{if } \overline{\Delta}^{(k)} \neq 0 \text{ and } 2\overline{l}^{(k-1)} \leq k-1 \quad (27) \end{cases}$$

$$\overline{B}^{(k)}(x) = \begin{cases} x \cdot \overline{B}^{(k-1)}(x), & \text{if } \overline{\Delta}^{(k)} = 0 \text{ or if } 2\overline{l}^{(k-1)} > k-1 \quad (28) \\ \overline{D}^{(k-1)}(x), & \text{if } \overline{\Delta}^{(k)} \neq 0 \text{ and } 2\overline{l}^{(k-1)} \leq k-1 \quad (29) \end{cases}$$

$$\overline{l}^{(k)}(x) = \begin{cases} \overline{l}^{(k-1)}, & \text{if } \overline{\Delta}^{(k)} = 0 \text{ or if } 2\overline{l}^{(k-1)} > k-1 \quad (30) \\ k - \overline{l}^{(k-1)}, & \text{if } \overline{\Delta}^{(k)} \neq 0 \text{ and } 2\overline{l}^{(k-1)} \leq k-1 \quad (31) \end{cases}$$

$$\gamma^{(k)} = \begin{cases} \gamma^{(k-1)}, & \text{if } \overline{\Delta}^{(k)} = 0 \text{ or if } 2\overline{l}^{(k-1)} > k-1 \quad (32), (33) \\ \overline{\Delta}^{(k)}, & \text{if } \overline{\Delta}^{(k)} \neq 0 \text{ and } 2\overline{l}^{(k-1)} \leq k-1; \end{cases}$$

and d. repeat step (a).

8. A device comprising a dedicated circuit configured to correct errors in data stored using Reed-Solomon encoding, a dedicated circuit configured to solve an error locator polynomial and an error evaluator polynomial by iteration without performing polynomial division and inverses during iteration, and further comprising a dedicated circuit configured to:

a. determine an error locator polynomial according to the equation:

$$\sigma(x) = \frac{\overline{C}^{(d-1)}(x)}{\beta}; \quad (47)$$

and b. determine an error evaluator polynomial according to the equation:

$$P(x) = \Omega(x) - \sigma(x) = \frac{\overline{D}^{(d-1)}(x)}{\beta} - \sigma(x). \quad (48)$$

* * * * *

UNITED STATES PATENT AND TRADEMARK OFFICE
CERTIFICATE OF CORRECTION

PATENT NO. : 6,209,115 B1
DATED : March 27, 2001
INVENTOR(S) : T. K. Truong, Shen-Li Fu and T.C. Cheng It is certified that error appears in the above-identified patent and that said Letters Patent is hereby corrected as shown below:

<u>Column 40,</u>
Line 62, replace "If" with -- if --.

Signed and Sealed this

Twenty-third Day of April, 2002

Attest:

Attesting Officer

JAMES E. ROGAN
*Director of the United States Patent and Trademark Office*